(12) United States Patent
Tsai et al.

(10) Patent No.: US 11,916,107 B2
(45) Date of Patent: Feb. 27, 2024

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chun Hsiung Tsai, Xinpu Township (TW); Chih-Hsin Ko, Fongshan (TW); Clement Hsing Jen Wann, Carmel, NY (US); Ya-Yun Cheng, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/097,057

(22) Filed: Jan. 13, 2023

(65) Prior Publication Data

US 2023/0154980 A1 May 18, 2023

Related U.S. Application Data

(63) Continuation of application No. 16/856,817, filed on Apr. 23, 2020, now Pat. No. 11,557,650, which is a
(Continued)

(51) Int. Cl.
*H01L 29/06* (2006.01)
*H01L 29/66* (2006.01)
(Continued)

(52) U.S. Cl.
CPC .... *H01L 29/0653* (2013.01); *H01L 29/66553* (2013.01); *H01L 29/66568* (2013.01);
(Continued)

(58) Field of Classification Search
CPC .......... H01L 29/785; H01L 21/823431; H01L 29/41791; H01L 29/7851; H01L 29/0649; H01L 29/0673; H01L 29/66795; H01L 29/42392; H01L 29/66818; H01L 29/7371; H01L 21/26513; H01L 29/0817; H01L 29/0821; H01L 29/1004; H01L 29/165;
(Continued)

(56) References Cited

U.S. PATENT DOCUMENTS 9,324,846 B1 * 4/2016 Camillo-Castillo .......................
H01L 29/0817
9,711,608 B1 7/2017 Duriez et al.
(Continued)

FOREIGN PATENT DOCUMENTS

CN 107464840 A 12/2017
TW 201816935 A 5/2018

*Primary Examiner* — Mouloucoulaye Inoussa
(74) *Attorney, Agent, or Firm* — STUDEBAKER & BRACKETT PC

(57) ABSTRACT

A semiconductor device including a FET includes an isolation insulating layer disposed in a trench of the substrate, a gate dielectric layer disposed over a channel region of the substrate, a gate electrode disposed over the gate dielectric layer, a source and a drain disposed adjacent to the channel region, and an embedded insulating layer disposed below
(Continued)

the source, the drain and the gate electrode and both ends of the embedded insulating layer are connected to the isolation insulating layer.

20 Claims, 31 Drawing Sheets

Related U.S. Application Data continuation-in-part of application No. 16/731,767, filed on Dec. 31, 2019, now Pat. No. 11,393,713.

(60) Provisional application No. 62/955,871, filed on Dec. 31, 2019, provisional application No. 62/837,519, filed on Apr. 23, 2019.

(51) Int. Cl.
    *H01L 21/306*     (2006.01)
    *H01L 21/265*     (2006.01)
    *H01L 21/3065*    (2006.01)

(52) U.S. Cl.
    CPC .... *H01L 21/26513* (2013.01); *H01L 21/3065* (2013.01); *H01L 21/30604* (2013.01)

(58) Field of Classification Search
    CPC ............. H01L 29/407; H01L 29/41708; H01L 29/42304; H01L 29/45; H01L 21/764; H01L 29/1083; H01L 23/66; H01L 27/1203; H01L 21/76283; H01L 21/02532; H01L 21/26533; H01L 21/76267; H01L 21/02164; H01L 21/02236; H01L 21/84; H01L 21/02255; H01L 29/66242
    USPC ....... 257/197, 329, 586, 565, 593, 522, 347, 257/412, 288, 300, 350, 368, 401, 283, 257/E21.41; 438/318, 319, 268, 359, 438/335, 421, 151, 164, 479, 517, 296, 438/492
See application file for complete search history.

(56) References Cited

U.S. PATENT DOCUMENTS

| | | | |
|---|---|---|---|
| 9,984,936 B1* | 5/2018 | Xie | H01L 29/66439 |
| 10,790,355 B2 | 9/2020 | Shinkawata | |
| 2002/0072206 A1 | 6/2002 | Chen et al. | |
| 2002/0182787 A1* | 12/2002 | Bae | H01L 21/76264 438/149 |
| 2004/0217434 A1* | 11/2004 | Lee | H01L 29/66795 257/E21.426 |
| 2007/0037341 A1* | 2/2007 | Rueger | H01L 21/76224 257/E21.546 |
| 2010/0187657 A1* | 7/2010 | Boeck | H01L 29/0649 438/335 |
| 2011/0115021 A1* | 5/2011 | Dennard | H01L 21/76232 257/E21.546 |
| 2012/0098039 A1* | 4/2012 | Miu | H01L 29/7371 438/318 |
| 2012/0292700 A1* | 11/2012 | Khakifirooz | H01L 29/42384 438/164 |
| 2014/0151852 A1* | 6/2014 | Adkisson | H01L 29/7375 438/359 |
| 2014/0327111 A1* | 11/2014 | Camillo-Castillo | H01L 29/0649 257/586 |
| 2014/0353725 A1* | 12/2014 | Adkisson | H01L 29/66242 438/318 |
| 2015/0137185 A1* | 5/2015 | Camillo-Castillo | H01L 29/66242 438/319 |
| 2015/0137186 A1* | 5/2015 | Leidy | H01L 29/737 438/318 |
| 2015/0187892 A1 | 7/2015 | Yin et al. | |
| 2015/0348825 A1* | 12/2015 | Hebert | H01L 21/764 438/421 |
| 2016/0027727 A1* | 1/2016 | Kim | H10B 12/34 257/774 |
| 2018/0108675 A1* | 4/2018 | Schmidt | H01L 21/84 |
| 2019/0013382 A1* | 1/2019 | Stamper | H01L 23/66 |

\* cited by examiner

SEMICONDUCTOR DEVICE AND MANUFACTURING METHOD THEREOF

RELATED APPLICATIONS

This application is a continuation of U.S. patent application Ser. No. 16/856,817, now U.S. Pat. No. 11,557,650, filed Apr. 23, 2020, which claims priority to U.S. Provisional Patent Application No. 62/837,519 filed on Apr. 23, 2019 and priority to U.S. Provisional Patent Application No. 62/955,871 filed Dec. 31, 2019, and is a continuation-in-part of application Ser. No. 16/731,767 filed on Dec. 31, 2019, which claims priority to U.S. Provisional Patent Application No. 62/837,519 filed on Apr. 23, 2019, the entire contents each of which are incorporated herein by reference.

BACKGROUND

In order to reduce power consumption in a semiconductor device, reducing parasitic capacitance is one of the key technologies. Existing planer complementary metal oxide semiconductor field effect transistors (CMOS FETs) have diffused source/drains (S/D) that induce parasitic capacitance between the S/D region and the substrate.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, source/drain regions of a field effect transistor (FET). The embodiments such as those disclosed herein are generally applicable not only to a planar FET but also other FETs.

Figure 1A:
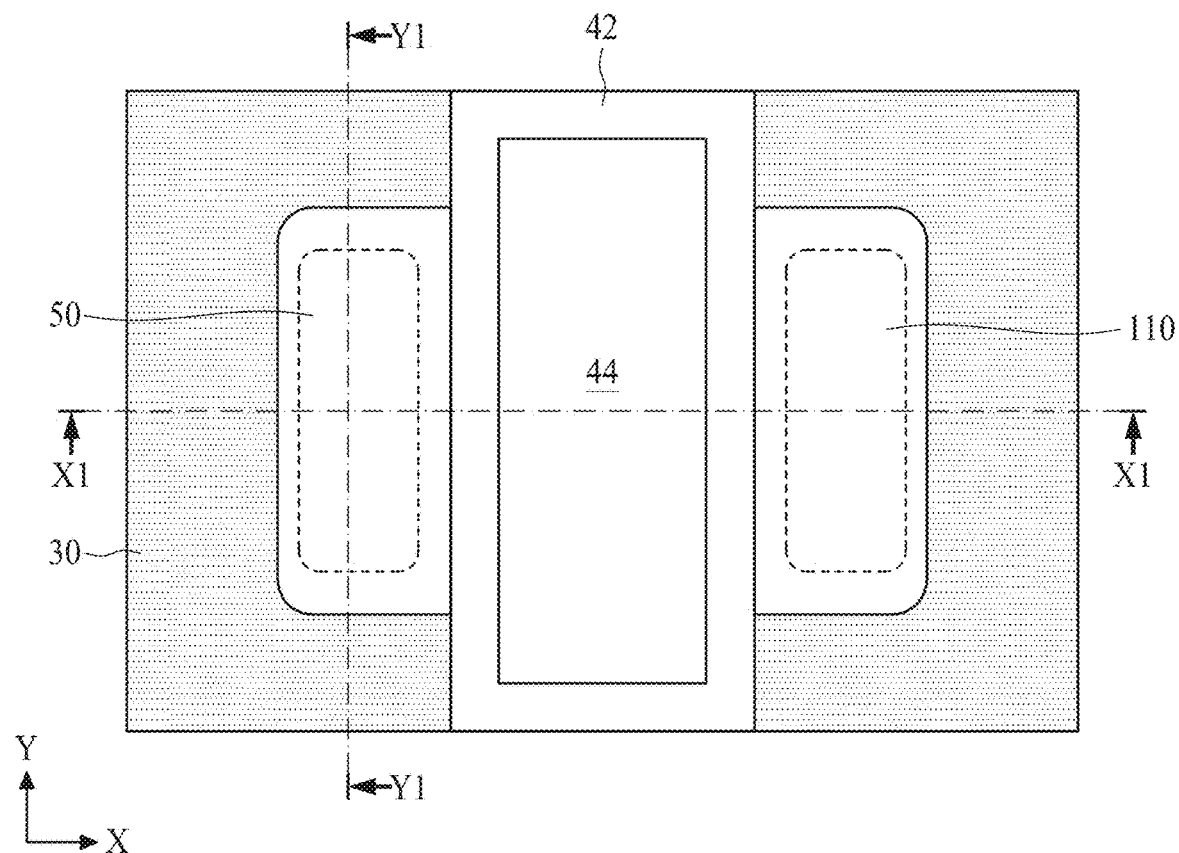
FIG. 1A shows a plan view and FIGS. 1B, 1C, 1D and 1E show cross sectional views of a semiconductor device according to embodiments of the present disclosure.
Figure 1B:
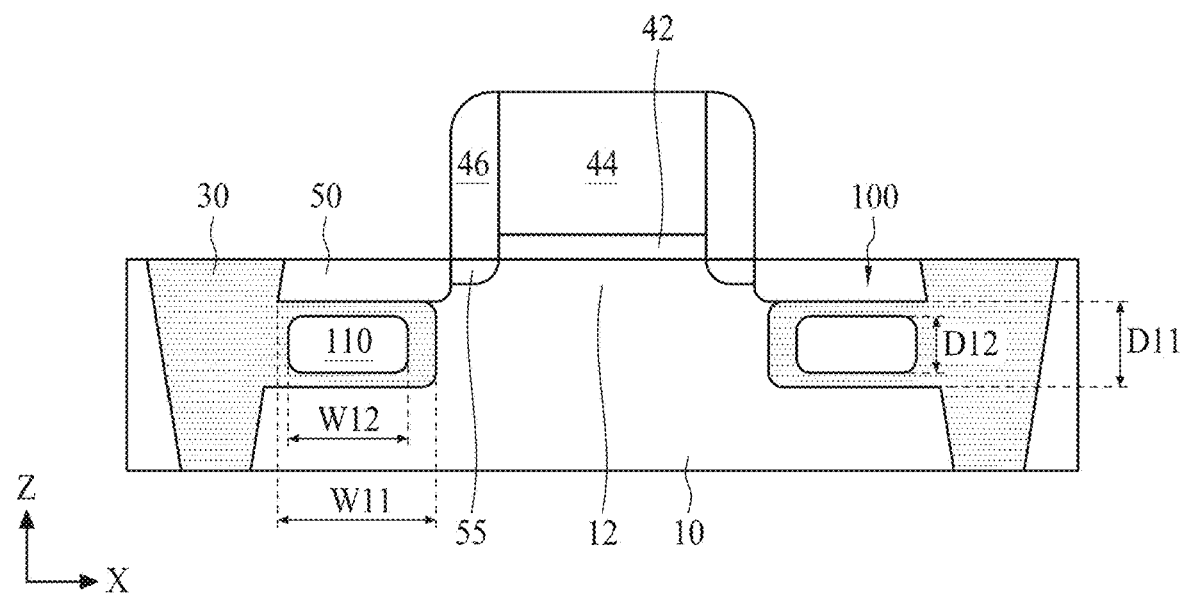

FIG. 1A shows a plan view, FIG. 1B shows a cross sectional view corresponding to line X1-X1 (along the X, i.e., source-to-drain, direction) of FIG. 1A, and FIGS. 1C, 1D and 1E show cross sectional views corresponding to line Y1-Y1 (along the Y, i.e., gate extending, direction) of FIG. 1A of a semiconductor device according to embodiments of the present disclosure.

As shown, an FET is formed over a substrate 10. The FET includes a gate dielectric layer 42 disposed over a channel region 12 of the substrate 10 and a gate electrode layer 44. Gate sidewall spacers 46 are disposed on opposing side faces of the gate electrode layer 44.

The substrate 10 is, for example, a p-type silicon or germanium substrate with an impurity concentration in a range from about $1\times10^{15}$ cm$^{-3}$ to about $1\times10^{16}$ cm$^{-3}$. In some embodiments, a p+ silicon substrate is used. In other embodiments, the substrate is an n-type silicon or germanium substrate with an impurity concentration in a range from about $1\times10^{15}$ cm$^{3}$ to about $1\times10^{16}$ cm$^{-3}$.

Alternatively, the substrate 10 may comprise another elementary semiconductor, such as germanium; a compound semiconductor including Group IV-IV compound semiconductors such as SiC, SiGe and SiGeSn, or combinations thereof. In one embodiment, the substrate 10 is a silicon layer of an SOI (silicon-on insulator) substrate. The substrate 10 may include various regions that have been suitably doped with impurities (e.g., p-type or n-type conductivity).

The gate dielectric layer 42 includes one or more layers of dielectric materials, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer is in a range from about 1 nm to about 20 nm in some embodiments, and may be in a range from about 2 nm to about 10 nm in other embodiments.

The gate electrode layer 44 includes one or more conductive layers. In some embodiments, the gate electrode layer 44 is made of doped poly silicon. In other embodiments, the gate electrode layer 44 includes metallic material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate length (along the X direction) is in a range from about 20 nm to about 200 nm and is in a range from about 40 nm to about 100 nm in other embodiments.

In certain embodiments of the present disclosure, one or more work function adjustment layers are interposed between the gate dielectric layer 42 and a body metal gate electrode 44. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For an n-channel FET, one or more of TaN, TaAlC, TiN, TiC, Co, TiAl, TiSi and TaSi is used as the work function adjustment layer, and for a p-channel FET, one or more of TiAlC, Al, TiAl, TaN, TaAlC, TiN, TiC and Co is used as the work function adjustment layer. When metallic materials are used as the gate electrode layer, a gate replacement technology is employed to fabricate the gate structure.

The gate sidewall spacers 46 include one or more layers of insulating material, such as SiO$_2$, SiN, SiON, SiOCN or SiCN, which are formed by CVD, PVD, ALD, e-beam evaporation, or other suitable process. A low-k dielectric material may be used as the sidewall spacers. The sidewall spacers 46 are formed by forming a blanket layer of insulating material over the gate electrode layer 44 and performing anisotropic etching. In one embodiment, the sidewall spacer layers are made of silicon nitride based material, such as SiN, SiON, SiOCN or SiCN.

Figure 1C:
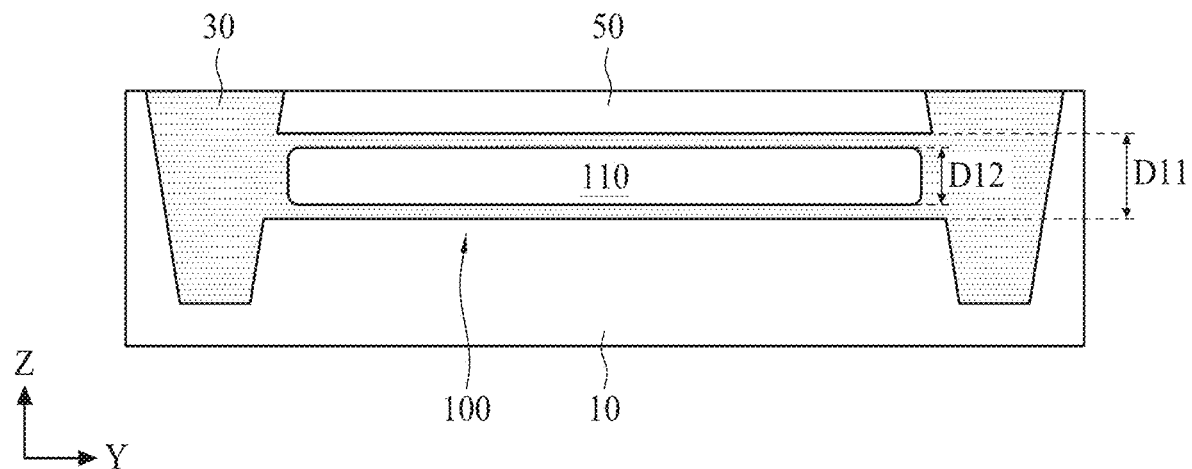

The FET shown in FIGS. 1A-1C also includes source/drain diffusion regions 50 and source/drain extension regions 55. The source/drain diffusion regions 50 are n+ or p+ regions formed by, for example, one or more ion implant operations or thermal diffusion operations. The source/drain extension regions 55 are n, n−, p or p− regions formed by, for example, one or more pocket implantations. The source/drain extension regions 55 are formed under the gate sidewall spacers 46, as shown in FIG. 1B. In some embodiments, the source/drain diffusion regions 50 include one or more epitaxial semiconductor layers, which form a raised source/drain structure.

The FET shown in FIGS. 1A-1C further includes isolation insulating regions 30, which are also referred to as shallow trench isolation (STI) regions to electrically separate the FET from other electric devices formed on the substrate 10. The isolation insulating regions 30 include one or more silicon-based insulating layers in some embodiments.

The FET shown in FIGS. 1A-1C includes air spacers (air gaps) 110 in spaces 100 having a rectangular cross section under the source/drain diffusion regions 50. The air spacers 110 are enclosed by the insulating material forming the isolation insulating region 30 in some embodiments. The air spacers 110 can eliminate or suppress junction capacitance between the source/drain diffusion regions 50 and the substrate 10. In some embodiments, no air spacer is disposed below the channel region.

In some embodiments, the width W11 in the X direction of the space 100 is in a range from about 100 nm to about 500 nm, and is in a range from about 200 nm to about 400 nm in other embodiments. A ratio of the width W12 in the X direction of the air spacer 110 to the width W11 (W12/W11) is in a range from 0.5 to 0.95 in some embodiments, and is in a range from about 0.7 to 0.9 in other embodiments.

In some embodiments, the depth D11 in the Z direction of the space 100 is in a range from about 10 nm to about 200 nm, and is in a range from about 30 nm to about 100 nm in other embodiments. A ratio of the depth D12 in the Z direction of the air spacer 110 to the depth D11 of the space 100 (D12/D11) is in a range from about 0.5 to about 0.9 in some embodiments, and is in a range from about 0.6 to about 0.8 in other embodiments. An aspect ratio of the width W11 of the space 100 to the depth D11 (W11/D11) of the space 100 is in a range from about 1 to about 10 in some embodiments, and is in a range from about 2 to about 5 in other embodiments.

In some embodiments, an aspect ratio (W11/D11) of the space 100 is in a range from about 2 to about 10 and is in a range from about 3 to about 8 in other embodiments. In some embodiments, an aspect ratio (W12/D12) of the air spacer 110 is in a range from about 2 to about 10 and is in a range from about 3 to about 8 in other embodiments.

When the aspect ratio W11/D11 and the aspect ratio W12/D12 are smaller than the above ranges, for example, W11 or W12 is smaller, the air spacer 110 and/or an embedded insulating layer do not sufficiently penetrate under the source/drain diffusion regions, and thus it may not sufficiently suppress parasitic capacitance under source/drain diffusion regions. When the aspect ratio W11/D11 and the aspect ratio W12/D12 are larger than the above ranges, for example, D11 or D12 is smaller, the capacitance of the embedded insulating layer (parasitic capacitance) becomes larger, and it is difficult to remove the sacrificial layer 20 to form the space 100.

Figure 1D:
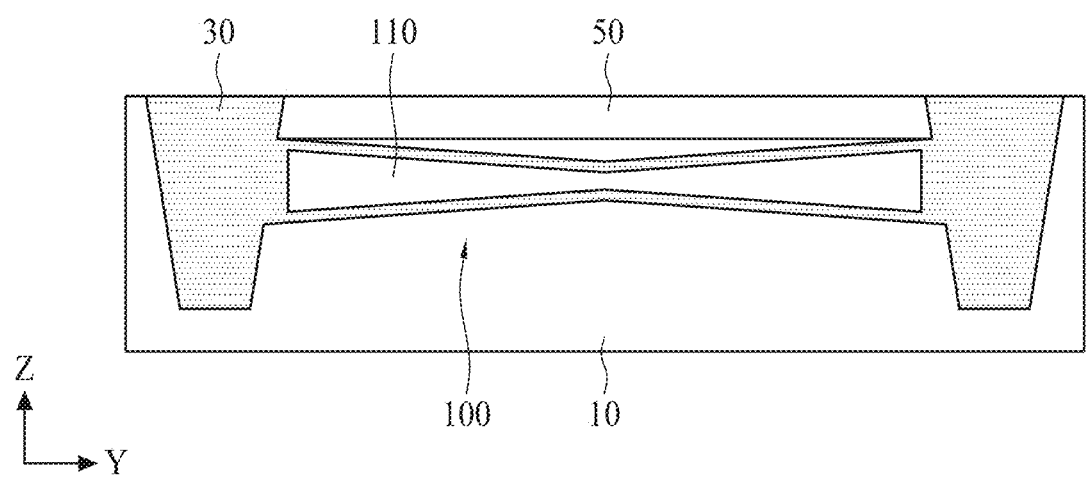
Figure 1E:
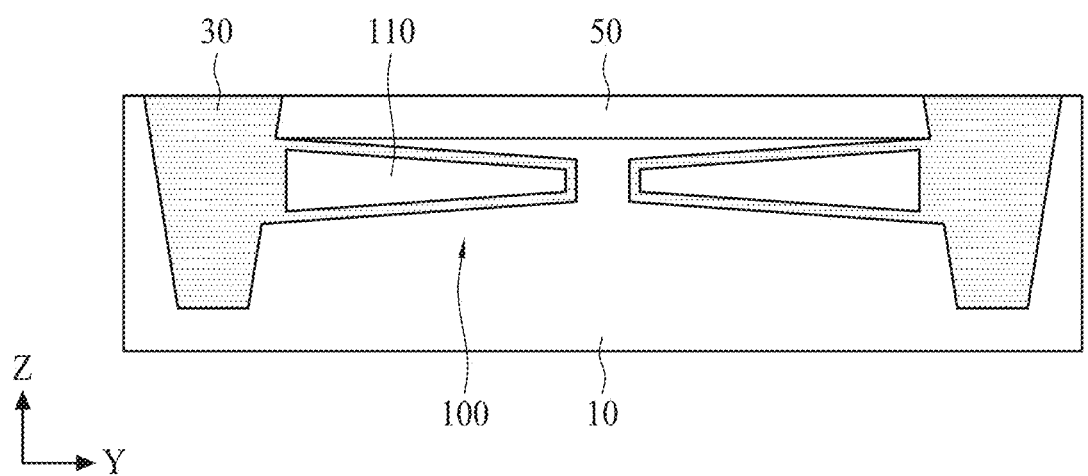

As shown in FIG. 1C, the space 100 and/or the air spacer 110 are continuously disposed along the Y direction under the source/drain diffusion region 50 with a substantially constant depth D12. In other embodiments, the space 100 and/or the air spacer 110 are discontinuous along the Y direction. In some embodiments, the depth D11 of the space 100 and/or the depth D12 of the air spacer 110 become smaller as a distance from the isolation insulating region 30 toward the center portion increases as shown in FIG. 1D. In some embodiments, two spaces 100 formed from the left side and from the right side do not meet, and are separated by a part of the substrate 10, as shown in FIG. 1E.

Figure 2A:
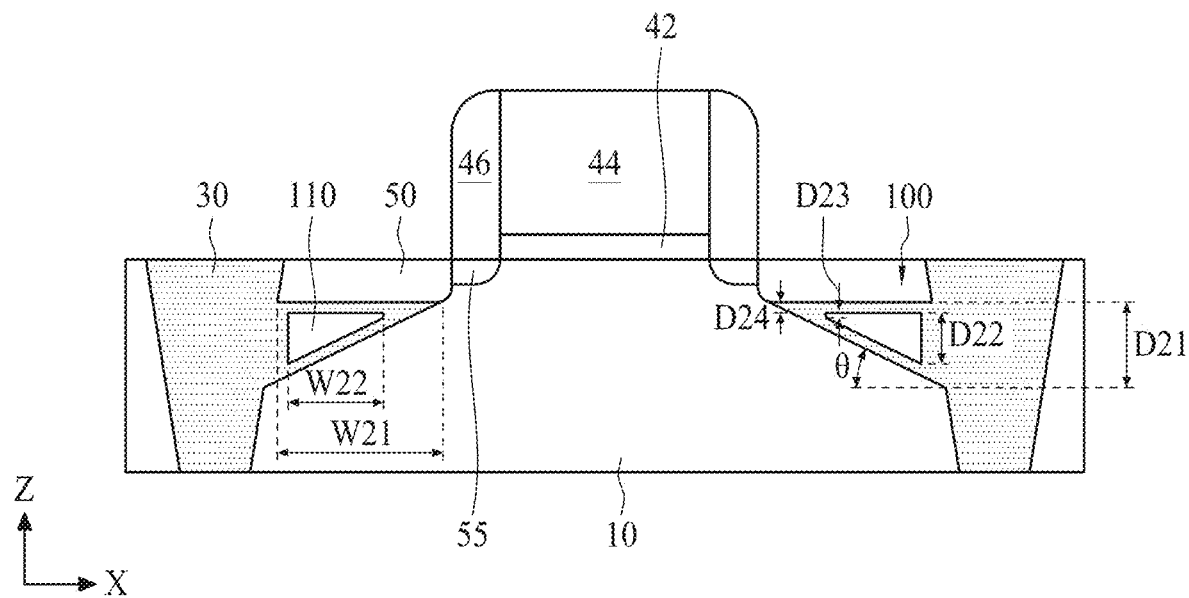
FIGS. 2A, 2B and 2C show cross sectional views of a semiconductor device according to embodiments of the present disclosure.
Figure 2B:
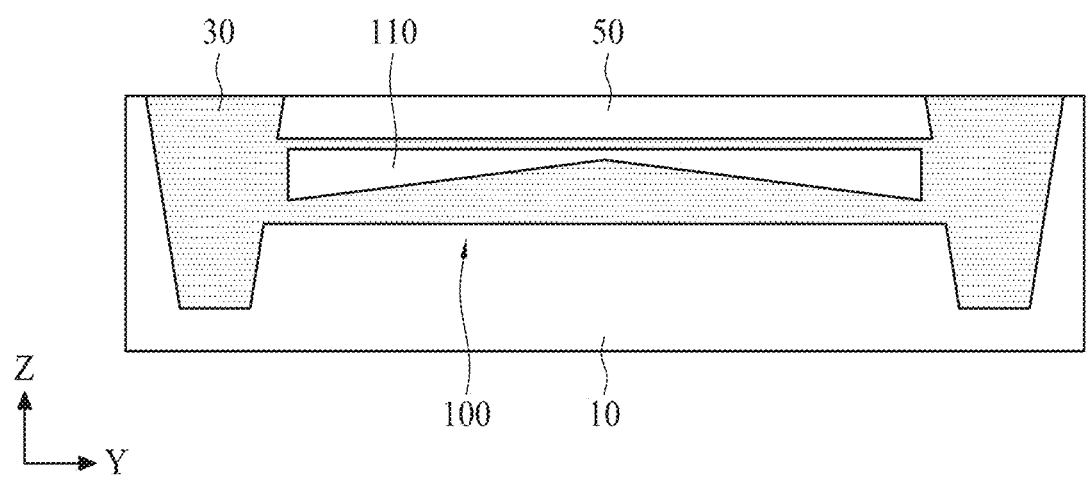
Figure 2C:
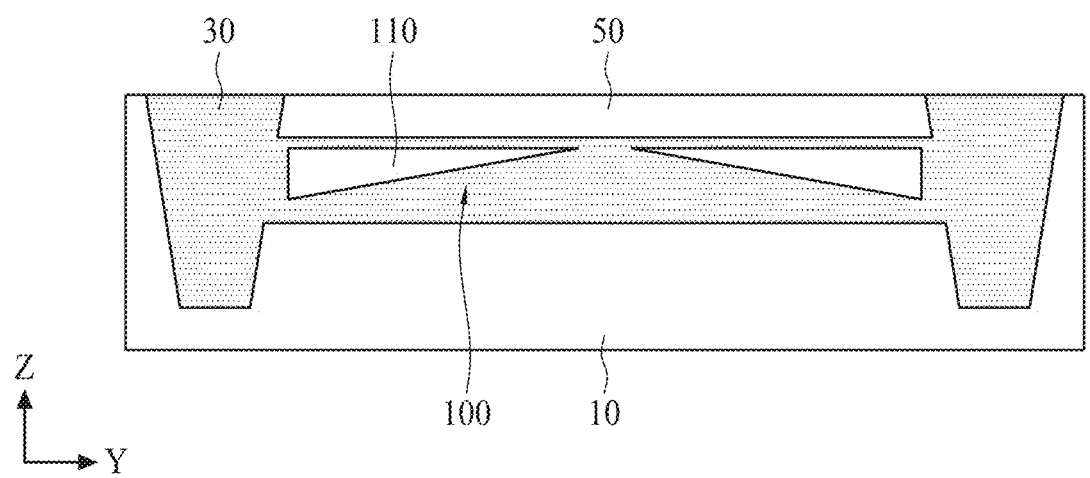

FIG. 2A shows a cross sectional view corresponding to line X1-X1 (along the X, i.e., source-to-drain, direction) of FIG. 1A, and FIGS. 2B and 2C show a cross sectional view corresponding to line Y1-Y1 (along the Y, i.e., gate extending, direction) of FIG. 1A of a semiconductor device according to embodiments of the present disclosure. Materials, configurations, dimensions, processes and/or operations same as or similar to those described with the foregoing embodiments may be employed in the following embodiments and the detailed explanation may be omitted.

In embodiments shown in FIGS. 2A-2C, the space 100 and the air spacer 110 have a triangular shape or a trapezoid shape.

In some embodiments, the width W21 in the X direction of the space 100 is in a range from about 100 nm to about 500 nm, and is in a range from about 200 nm to about 400 nm in other embodiments. A ratio of the width W22 in the X direction of the air spacer 110 to the width W21 (W22/W21) is in a range from about 0.5 to about 0.95 in some embodiments, and is in a range from about 0.7 to about 0.9 in other embodiments.

In some embodiments, the depth D21 in the Z direction of the space 100 at the entrance of the space 100 (an edge of the isolation insulating layer 30) is in a range from about 10 nm to about 200 nm, and is in a range from about 30 nm to about 100 nm in other embodiments. A ratio of the largest depth D22 in the Z direction of the air spacer 110 to the depth D21 of the space 100 (D22/D21) is in a range from about 0.5 to about 0.9 in some embodiments, and is in a range from about 0.6 to 0.8 in other embodiments. When the ratio D22/D21 is smaller than these ranges, the volume of the air spacer 110 is too small to obtain sufficient reduction of parasitic capacitance. In some embodiments, a ratio of the smallest depth D23 in the Z direction of the air spacer 110 to the largest depth D22 (D23/D22) of the air spacer 110 is in a range from about 0.1 to about 0.9, and is in a range from about 0.4 to about 0.8 in other embodiments. When the ratio D23/D22 is out of these ranges, it may not sufficiently suppress parasitic capacitance under source/drain diffusion regions and/or it is difficult to remove the sacrificial layer 20 to form the space 100. A ratio of the width W21 of the space 100 to the largest depth D21 of the space 100 (W21/D21) is in a range from about 1 to about 10 in some embodiments, and is in a range from about 2 to about 5 in other embodiments. When the ratio W21/D21 is smaller than the above ranges, for example, W21 is smaller, the air spacer 110 and/or an embedded insulating layer do not sufficiently penetrate under the source/drain diffusion regions, and thus it may not sufficiently suppress parasitic capacitance under source/drain diffusion regions. When the ratio W21/D21 is larger than the above ranges, for example, D21 is smaller, the capacitance of the embedded insulating layer (parasitic capacitance) becomes larger, and it is difficult to remove the sacrificial layer 20 to form the space 100. In some embodiments, a ratio of the smallest depth D24 in the Z direction of the space 100 to the largest depth D21 (D24/D21) of the space 100 is in a range from about 0 to about 0.8 in some embodiments, and is in a range from about 0.4 to about 0.6 in other embodiments. When the ratio D24/D21 is out of these ranges, it may not sufficiently suppress parasitic capacitance under source/drain diffusion regions and/or it is difficult to remove the sacrificial layer 20 to form the space 100.

In some embodiments, the angle θ between the bottom face of the space 100 and the horizontal line (parallel to the upper surface of the substrate 10) is more than 0 degrees to 60 degrees or less. In other embodiments, the angle θ is in a range from about 15 degrees to 45 degrees. When the angle θ is too small, the air spacer 110 and/or an embedded insulating layer do not sufficiently penetrate under the source/drain diffusion regions, and thus it may not sufficiently suppress parasitic capacitance under source/drain diffusion regions.

As shown in FIG. 2B, the space 100 and/or the air spacer 110 are continuously disposed along the Y direction under the source/drain diffusion region 50. In some embodiments, the depth D11 of the space 100 and/or the depth of the air spacer 110 become smaller as a distance from the isolation insulating region 30 toward the center portion of the source/drain region 50 increases, as shown in FIG. 2B. In other embodiments, the space 100 and/or the air spacer 110 are discontinuous along the Y direction as shown in FIG. 2C.

FIGS. 3-12 show cross sectional views of various stages for manufacturing a FET device according to an embodiment of the present disclosure. It is understood that additional operations can be provided before, during, and after processes shown by FIGS. 3-12, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted.

Figure 3:
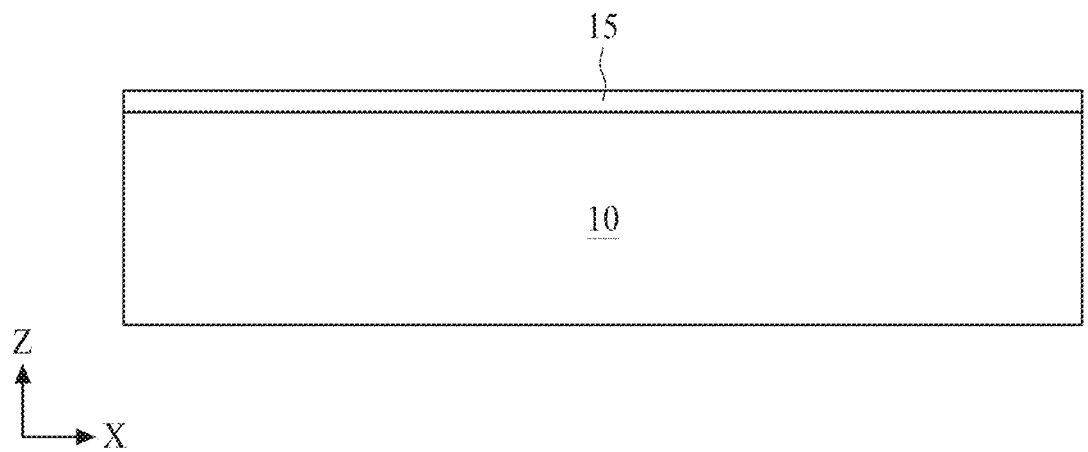
FIG. 3 shows a cross sectional view of one of the various stages of a manufacturing operation for a semiconductor device according to an embodiment of the present disclosure.

As shown in FIG. 3, a cover layer 15 is formed over the substrate 10. The cover layer 15 includes a single silicon oxide layer. In other embodiments, the cover layer 15 includes a silicon oxide layer and a silicon nitride layer formed on the silicon oxide layer. The silicon oxide layer can be formed by using thermal oxidation or a CVD process. The CVD process includes plasma-enhanced chemical vapor deposition (PECVD), an atmospheric pressure chemical vapor deposition (APCVD), a low-pressure CVD (LPCVD), and a high density plasma CVD (HDPCVD). An atomic layer deposition (ALD) may also be used. The thickness of the cover layer 15 is in a range from about 5 nm to about 50 nm in some embodiments, and is in a range from about 10 nm to about 30 nm in other embodiments.

In some embodiments, before or after the cover layer 15 is formed, one or more alignment key patterns are formed on the substrate 10.

Figure 4:
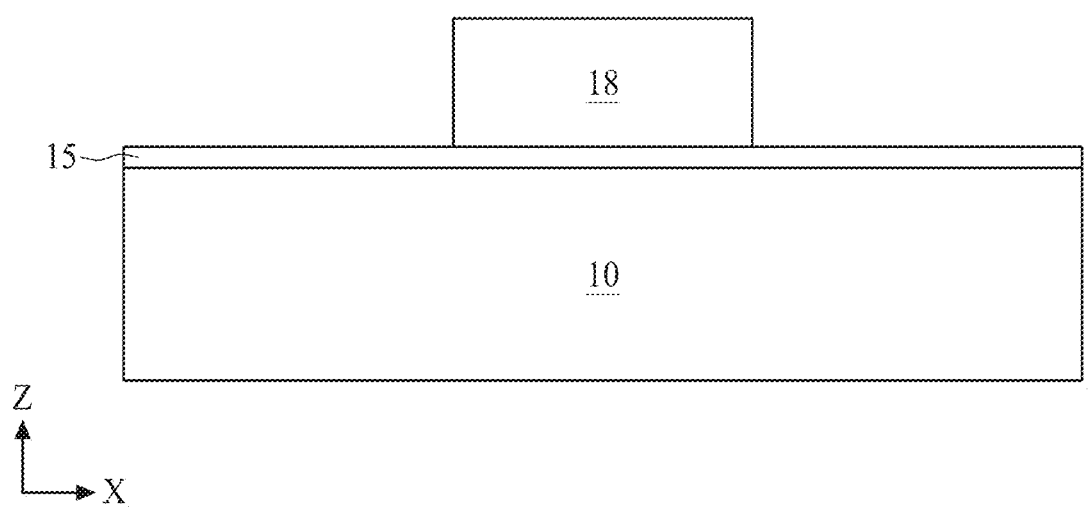
FIG. 4 shows a cross sectional view of one of the various stages of a manufacturing operation for a semiconductor device according to an embodiment of the present disclosure.

By using one or more lithography operations, a photo resist pattern as a first mask pattern 18 is formed over the cover layer 15 as shown in FIG. 4. The width and location of the first mask pattern 18 is substantially the same as the width and location of a gate electrode subsequently formed. The lithography operation is performed using the alignment key patterns formed on the substrate 10 in some embodiments. In some embodiments, the thickness of the photo resist pattern 18 is in a range from about 100 nm to 1000 nm.

Figure 5:
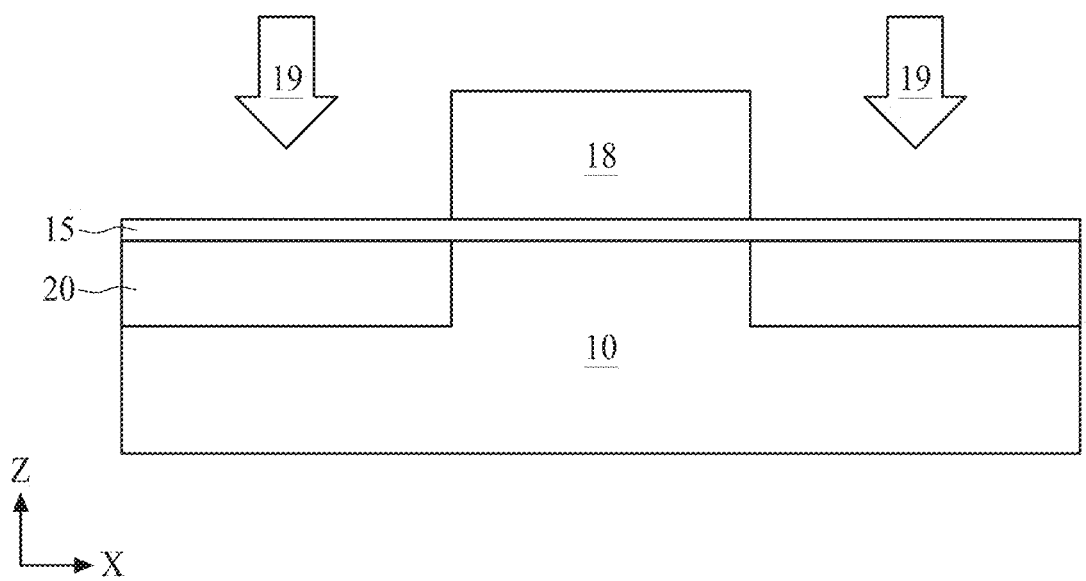
FIG. 5 shows a cross sectional view of one of the various stages of a manufacturing operation for a semiconductor device according to an embodiment of the present disclosure.

After the first mask pattern 18 is formed, one or more ion implantation operations 19 are performed to form sacrificial regions 20 containing dopants as shown in FIG. 5. In some embodiments, ions of arsenic (As) are implanted (doped) into the substrate 10. Ions of other dopant elements, such as P, As, Sb, Ge, N and/or C may also be used. In some embodiments, an acceleration voltage of the ion implantation 19 is in a range from about 0.5 keV to about 10 keV, and is in a range from about 2 keV to about 8 keV in other embodiments. A dose amount of the ions is in a range from about $5\times10^{13}$ ions/cm$^2$ to about $5\times10^{15}$ ions/cm$^2$ in some embodiments, and is in a range from about $1\times10^{14}$ ions/cm$^2$ to about $1\times10^{15}$ ions/cm$^2$ in other embodiments. The sacrificial regions 20 have a depth in a range from about 5 nm to about 80 nm in some embodiments, and the depth is in a range from about 20 nm to about 50 nm in other embodiments.

Figure 6:
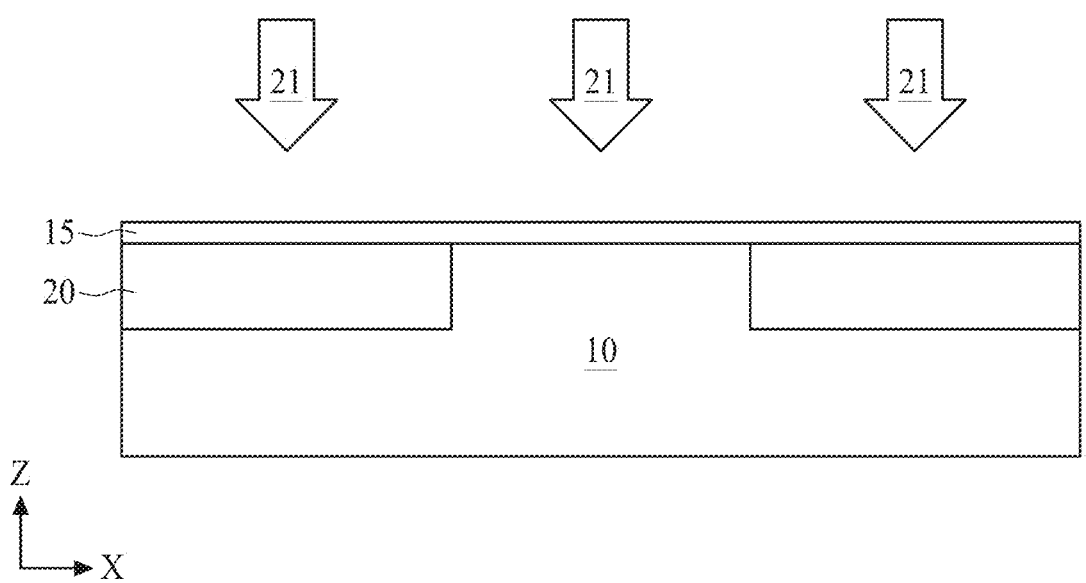
FIG. 6 shows a cross sectional view of one of the various stages of a manufacturing operation for a semiconductor device according to an embodiment of the present disclosure.

In some embodiments, after the ion implantation operations and removal of the mask layer 18, a thermal process 21, for example, an anneal process, is performed as shown in FIG. 6. In certain embodiments, the thermal process is performed by using rapid thermal annealing (RTA) 21 at a temperature in a range from about 900° C. to about 1050° C. for about 1 second to about 10 seconds in an inert gas ambient, such as an N$_2$, Ar or He ambient.

In some embodiments, an impurity concentration of the sacrificial layer 20 is in a range from about $1\times10^{19}$ atoms/cm$^3$ to about $5\times10^{21}$ atoms/cm$^3$, and is in a range from about $1\times10^{20}$ atoms/cm$^3$ to about $1\times10^{21}$ atoms/cm$^3$ in other embodiments.

After the annealing operation 21, the cover layer 15 is removed by using wet and/or dry etching operations.

Figure 7:
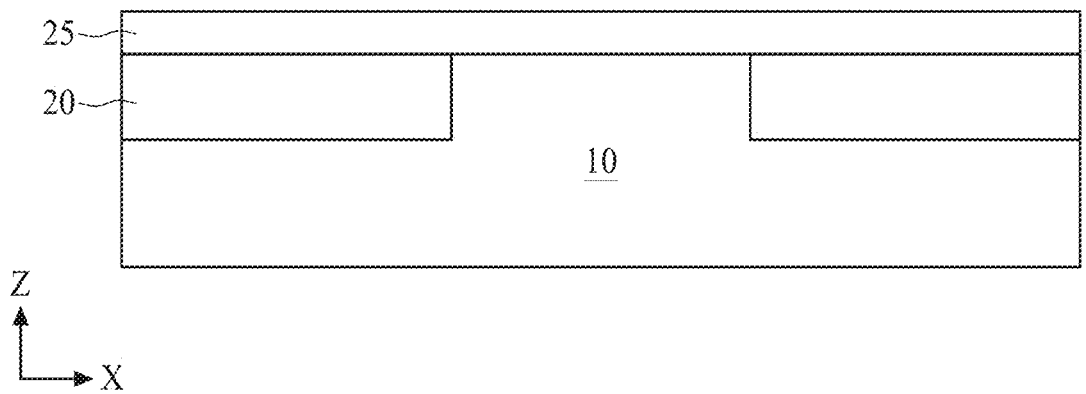
FIG. 7 shows a cross sectional view of one of the various stages of a manufacturing operation for a semiconductor device according to an embodiment of the present disclosure.

Then, as shown in FIG. 7, an epitaxial semiconductor layer 25 is formed over the substrate 10 including the sacrificial layer 20. In some embodiments, the epitaxial semiconductor layer 25 includes one of Si, SiGe and Ge. In certain embodiments, Si is epitaxially formed as the epitaxial semiconductor layer 25. The epitaxial semiconductor layer 25 may be grown at a temperature of about 600 to 800° C. at a pressure of about 5 to 50 Torr, by using a Si containing gas such as SiH$_4$, Si$_2$H$_6$ and/or SiCl$_2$H$_2$. A Ge containing gas, such as GeH$_4$, Ge$_2$H$_6$ and/or GeCl$_2$H$_2$ is used for the cases of SiGe or Ge. In some embodiments, the epitaxial semiconductor layer 25 is doped with n-type or p-type impurities. The thickness of the epitaxial semiconductor layer 25 is in a range from about 5 nm to about 100 nm in some embodiments, and is in a range from about 10 nm to about 30 nm in other embodiments.

Figure 8:
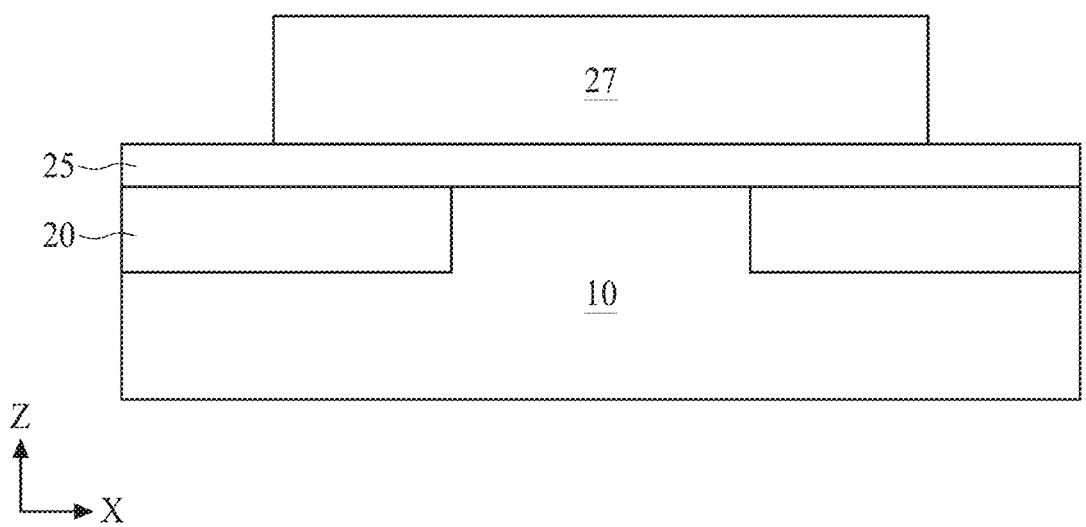
FIG. 8 shows a cross sectional view of one of the various stages of a manufacturing operation for a semiconductor device according to an embodiment of the present disclosure.

A second mask pattern 27 is then formed over the epitaxial semiconductor layer 25 as shown in FIG. 8. In some embodiments, the second mask pattern 27 is a photo resist pattern. In other embodiments, the second mask pattern 27 is a hard mask pattern made of one or more layers of silicon oxide, silicon nitride and SiON. In some embodiments, one or more cover layer is formed between the second mask pattern 27 and the epitaxial semiconductor layer 25. The cover layer is made of silicon oxide, silicon nitride and/or SiON. In certain embodiments, the cover layer includes a silicon oxide layer formed on the epitaxial semiconductor layer 25 and a silicon nitride layer formed on the silicon oxide layer.

Figure 9:
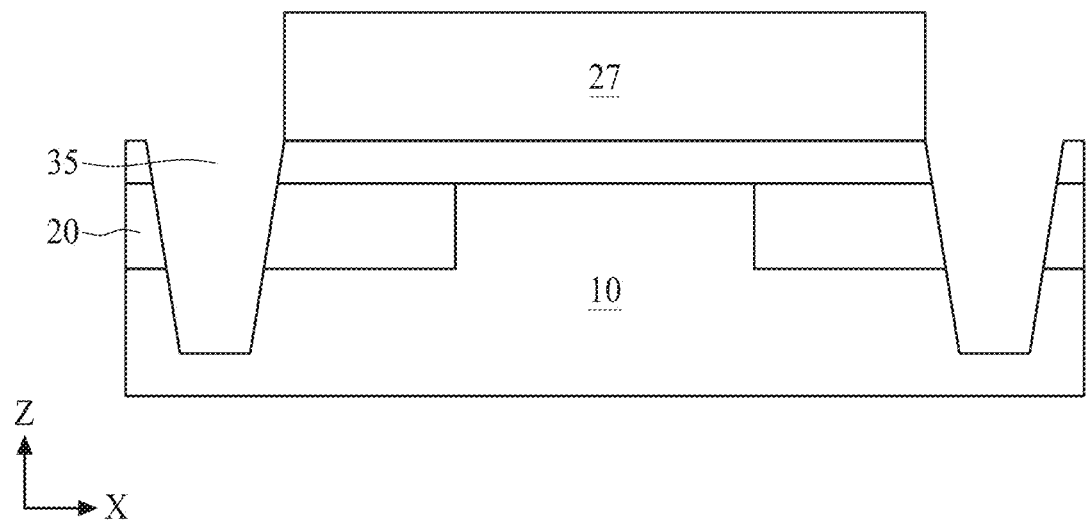
FIG. 9 shows a cross sectional view of one of the various stages of a manufacturing operation for a semiconductor device according to an embodiment of the present disclosure.

Subsequently, trenches 35 are formed by etching the epitaxial semiconductor layer 25, the sacrificial layer 20 and the substrate 10 as shown in FIG. 9. In some embodiments, plasma dry etching is used. In some embodiments, the etching gas includes a halogen containing gas, such as HBr. In some embodiments, the HBr gas is diluted with an inert gas, such as He and/or Ar. In some embodiments, a ratio of the HBr gas to the dilution gas is in a range from about 0.3 to about 0.7, and in other embodiments, the ratio is in a range from about 0.4 to about 0.6. Other gases suitable to etch silicon may be used.

Figure 10:
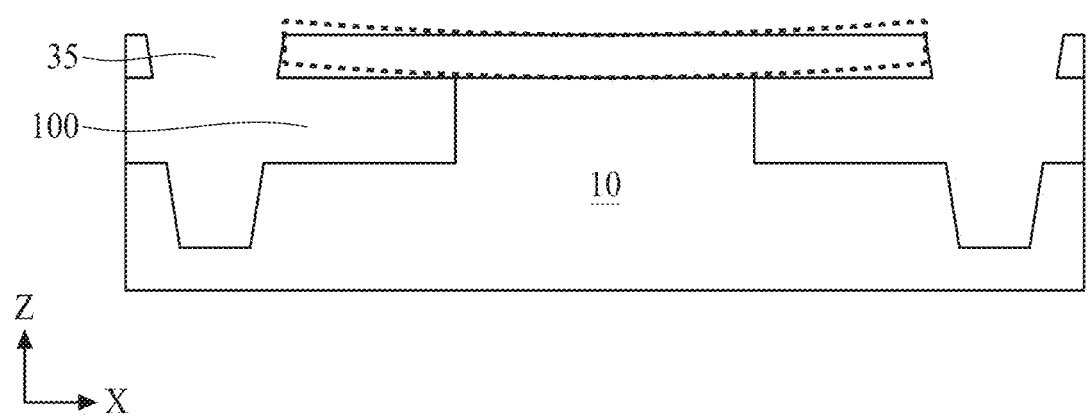
FIG. 10 shows a cross sectional view of one of the various stages of a manufacturing operation for a semiconductor device according to an embodiment of the present disclosure.

Next, as shown in FIG. 10, the sacrificial layer 20 is laterally etched to form spaces 100 as shown in FIG. 10. In some embodiments, plasma dry etching is used. In some embodiments, the etching gas includes a chlorine containing gas, such as HCl, Cl$_2$, CF$_3$Cl, CCl$_4$ or SiCl$_4$. In some embodiments, the chlorine containing gas is diluted with an inert gas, such as He and/or Ar. In some embodiments, a ratio of chlorine containing gas to the dilution gas is in a range from about 0.3 to about 0.7, and in other embodiments, the ratio is in a range from about 0.4 to about 0.6. In some embodiments, one or more additional gas, such as O$_2$, is added. Other gases suitable to etch silicon may be used. In some embodiments, an additional wet etching operation using a tetramethylammonium hydroxide (TMAH) aqueous solution is performed.

The etching of the sacrificial layer 20 containing dopants, such as As, is selective to the silicon substrate 10 and the epitaxial semiconductor layer 25. The etching selectivity is about 10 to about 100 in some embodiments. In some embodiments, the sacrificial layer 20 is substantially fully etched as shown in FIG. 10. In other embodiments, the sacrificial layer 20 is only partially etched, and thus part of the sacrificial layer 20 containing the dopants remains around the space 100. In such a case, an impurity containing layer having a higher dopant concentration than the substrate 10 and/or the epitaxial semiconductor layer 25 is disposed around the space 100.

In some embodiments, after the spaces 100 are formed, end portions of the epitaxial semiconductor layer 25 above the spaces 100 bend upward, forming a concave curved shape as shown by the broken line in FIG. 10. In other embodiments, the end portions of the epitaxial semiconductor layer 25 above the spaces 100 bend downward, forming a convex curved shape.

In some embodiments, less etching gas reaches an end of a long distance in the space, and thus the etching rate becomes smaller as the distance from the trench increases. In such a case, as shown in FIG. 1D, the depth in the Z direction and/or the width in the X direction decrease as the distance from the trench increases along the Y direction, and in some embodiments, two spaces formed from the left side and from the right side do not meet, and are separated by a part of the substrate, as shown in FIG. 1E.

Figure 11:
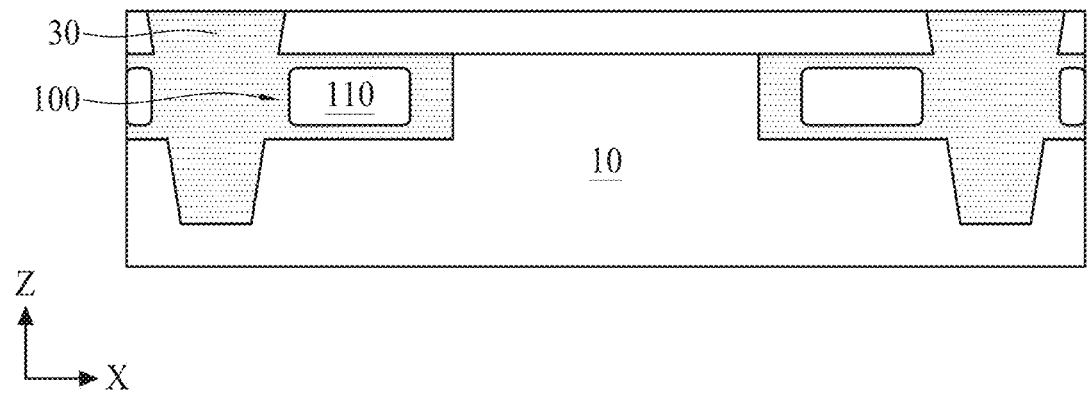
FIG. 11 shows a cross sectional view of one of the various stages of a manufacturing operation for a semiconductor device according to an embodiment of the present disclosure.

After the spaces 100 are formed, the isolation insulating layer 30 is formed in the trenches 35 and the spaces 100 as shown in FIG. 11. An insulating material for the isolation insulating layer 30 includes one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous. In other embodiments, an ALD method is used.

The insulating layer 30 is first formed in a thick layer so that the entire upper surface of the epitaxial semiconductor layer 25 is covered, and the thick layer is planarized so as to expose the upper surface of the epitaxial semiconductor layer 25. In some embodiments, a chemical mechanical polishing (CMP) process is performed as the planarization process. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

As shown in FIG. 11, the insulating material for the isolation insulating layer 30 does not fully fill the spaces 100 in some embodiments, so that air spacers 110 are formed in the space 100. In some embodiments, the air spacers 110 are fully surround the insulating material for the isolation insulating layer 30. The thickness of the insulating material at the top, bottom and lateral end of the spaces 100 is not uniform in some embodiments. In other embodiments, a part of the inner wall of the space 100, which is a semiconductor layer, is exposed in the air spacers 110. In some embodiments, the lateral end of the air spacer 110 opposite to the trench 35 includes a part of the substrate 10. In other embodiments, the lateral end of the air spacer 110 opposite to the trench 35 includes a part of the impurity containing layer. In some embodiments, a part of the upper boundary of the air spacer 110 includes a part of the epitaxial semiconductor layer 25 and/or includes a part of the impurity containing layer. In other embodiments, a part of the bottom boundary of the air spacer 110 includes a part of the substrate 10 and/or includes a part of the impurity containing layer. In some embodiments, the spaces 100 are fully filled by the insulating material and no air spacer is formed.

Figure 12:
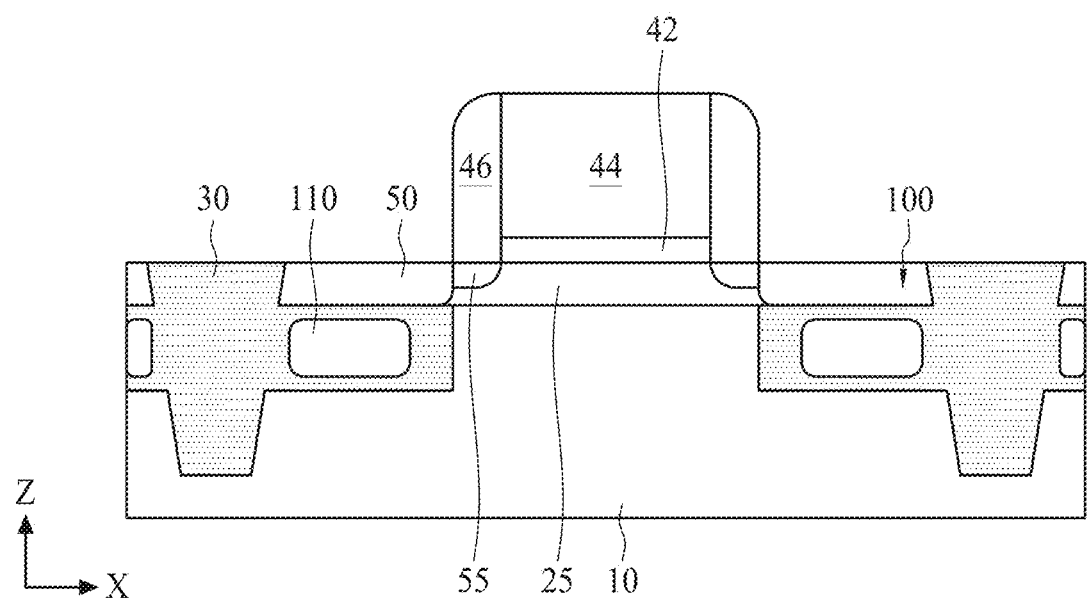
FIG. 12 shows a cross sectional view of one of the various stages of a manufacturing operation for a semiconductor device according to an embodiment of the present disclosure.

After the insulating layer 30 and the air spacers 110 are formed, a gate structure including the gate dielectric layer 42, the gate electrode layer 44 and the gate sidewall spacer 46 is formed over a channel region of the epitaxial semiconductor layer 25, as shown in FIG. 12. Further, the source/drain diffusion regions 50 and the source/drain extension regions 55 are formed as shown in FIG. 12. In some embodiments, a bottom of the source/drain diffusion region 50 is in contact with the insulating material 30 formed in the space 100. In other embodiments, the bottom of the source/drain diffusion region 50 is separated from the insulating material 30 formed in the space 100 by a part of the epitaxial semiconductor layer 25. The source/drain diffusion regions 50 are formed by one or more ion implantation operations or a thermal or plasma diffusion operation.

Figure 13:
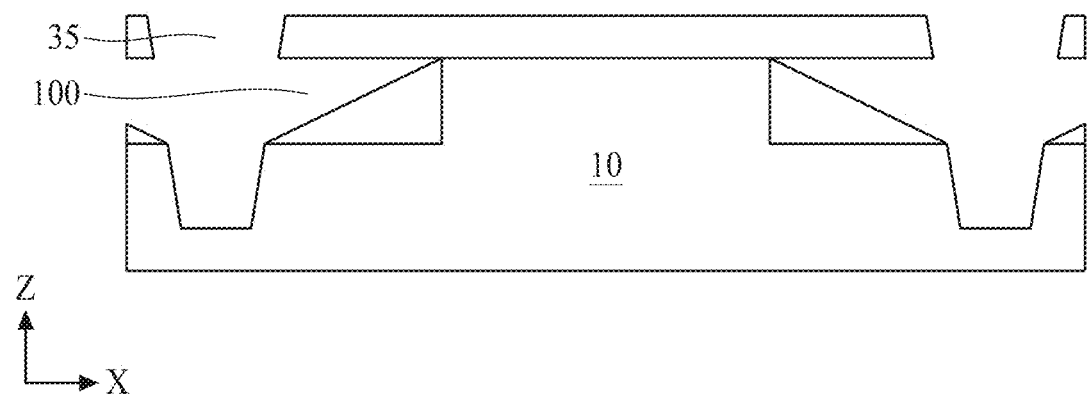
FIG. 13 shows a cross sectional view of one of the various stages of a manufacturing operation for a semiconductor device according to an embodiment of the present disclosure.
Figure 14:
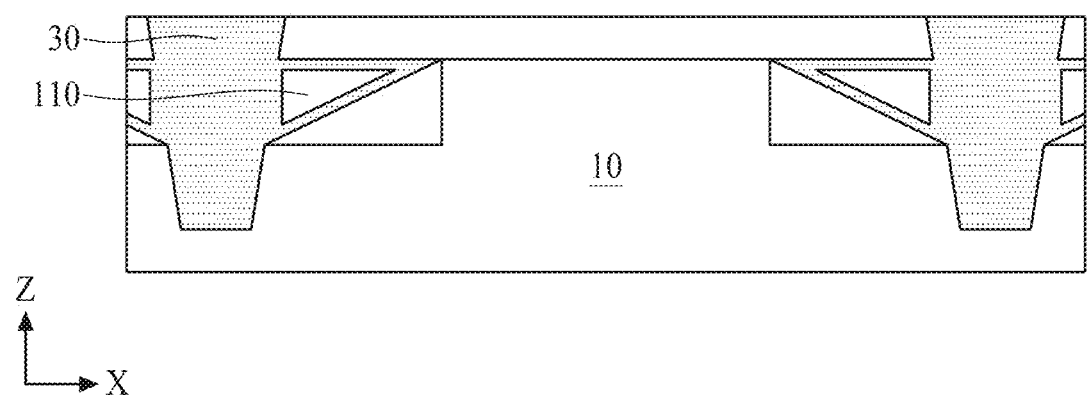
FIG. 14 shows a cross sectional view of one of the various stages of a manufacturing operation for a semiconductor device according to an embodiment of the present disclosure.
Figure 15:
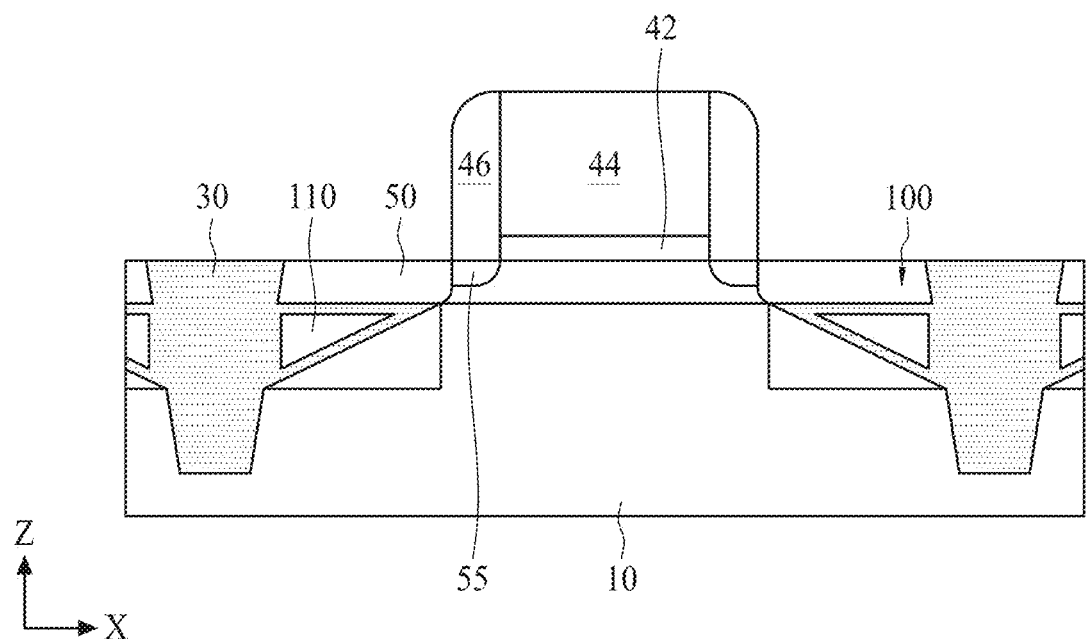
FIG. 15 shows a cross sectional view of one of the various stages of a manufacturing operation for a semiconductor device according to an embodiment of the present disclosure.

FIGS. 13-15 show cross sectional views of various stages for manufacturing a FET device according to an embodiment of the present disclosure. It is understood that additional operations can be provided before, during, and after processes shown by FIGS. 13-15, and some of the operations described below can be replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted.

After the trenches 35 are formed similar to FIG. 9, spaces 100 having a triangular or a trapezoid cross section are formed as shown in FIG. 13. In some embodiments, a wet etching operation using a TMAH aqueous solution is performed. During the wet etching, etching by-products fall on the bottom surface of the space being etched, and thus the etching rate of the bottom surface becomes smaller than the etching rate of the upper surface of the space being etched. Accordingly, the cross sectional shape has shape having a vertical depth that becomes smaller as a distance from the entrance of the space increases, such as a triangular or a trapezoid shape.

As shown in FIG. 13, an impurity containing layer (part of the sacrificial layer 20) having a higher impurity concentration than the substrate 10 and/or the epitaxial semiconductor layer 25 is disposed below or around the space 100.

Then, similar to the operations explained with respect to FIG. 11, the trenches 35 and the spaces 100 are filled with the insulating material for the isolation insulating layer 30, and the air spacers 110 are formed as shown in FIG. 14.

After the insulating layer 30 and the air spacers 110 are formed, a gate structure including the gate dielectric layer 42, the gate electrode layer 44 and the gate sidewall spacer 46 is formed over a channel region of the epitaxial semiconductor layer 25, as shown in FIG. 15. Further, the source/drain diffusion regions 50 and the source/drain extension regions 55 are formed as shown in FIG. 15. In some embodiments, a bottom of the source/drain diffusion region 50 is in contact with the insulating material formed in the space 100. In other embodiments, the bottom of the source/drain diffusion region 50 is separated from the insulating material formed in the space 100 by a part of the epitaxial semiconductor layer 25.

Figure 16:
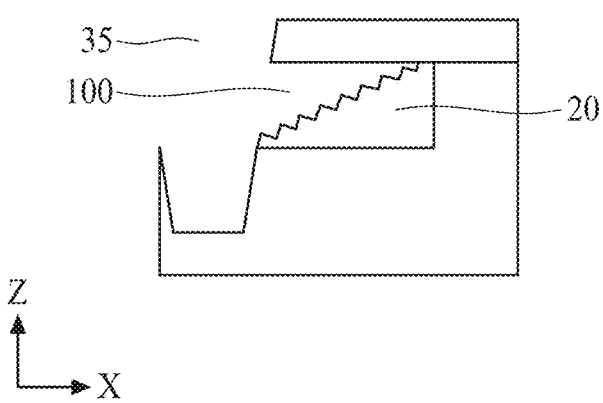
FIG. 16 shows a cross sectional view of a semiconductor device according to an embodiment of the present disclosure.

In some embodiments, at least one surface defining the space 100 has a zig-zag shape as shown in FIG. 16.

In some embodiments, less etchant reaches or contacts the end of a long distance in the space, and thus the etching rate becomes smaller as the distance from the trench increases. In such a case, as shown in FIG. 2B, the depth in the Z direction and/or the width in the X direction decrease as the distance from the trench increases along the Y direction, and in some embodiments, two spaces formed from the left side and from the right side do not meet, and are separated by a part of the substrate, as shown in FIG. 2C.

Figure 17:
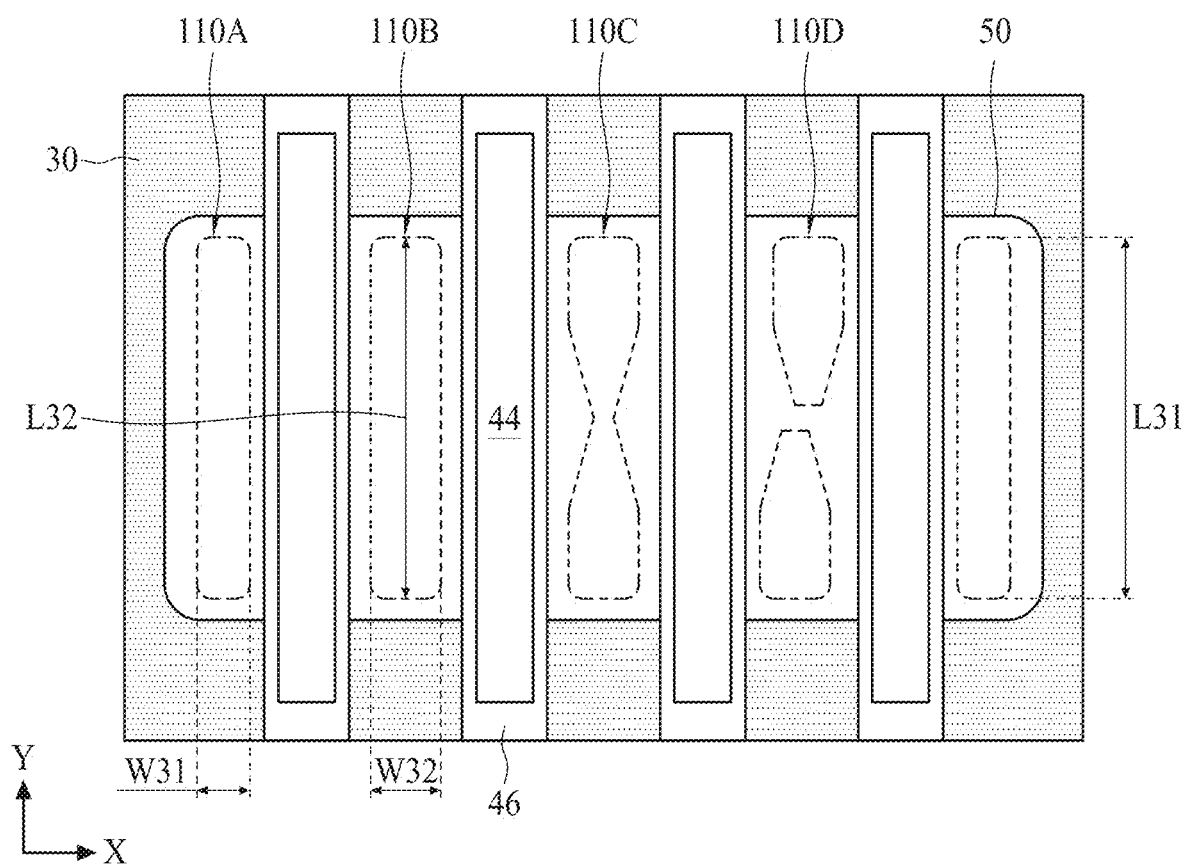
FIG. 17 shows a plan view of a semiconductor device according to an embodiment of the present disclosure.

FIG. 17 shows a plan view of a semiconductor device according to an embodiment of the present disclosure. Materials, configurations, dimensions, processes and/or operations same as or similar to those described with the foregoing embodiments may be employed in the following embodiments and the detailed explanation may be omitted.

In some embodiments, as shown in FIG. 17, a plurality of gate structures are disposed over one active region, which is channel regions and source/drain regions formed of a semiconductor and surrounded by the isolation insulating layer. In some embodiments, at least two of the plurality of gate electrodes 44 are connected, and in other embodiments, the plurality of gate electrodes 44 are not connected from each other. For illustration purposes, various configurations of air spacers are shown in one figure, but it should be understood that all the configuration do not necessarily exist in one device. In some embodiments, one or more configurations of the air spacers exist in one device.

In some embodiments, air spacers are disposed under the source/drain diffusion regions 50. In some embodiments, the air spacer 110B disposed under the source/drain diffusion region 50 between two gate structures 44/46 has different dimensions from the air spacer 110A disposed under the source/drain diffusion region 50 along the left and/or right gate structure. In some embodiments, the width W31 of the air spacer 110A under the source/drain diffusion region 50 at the left end or the right end is greater than the width W32 of the air spacer 110B under the source/drain diffusion region 50 between two gate structures. In some embodiments, the length L31 of the air spacer 110A under the source/drain diffusion region 50 at the left end or the right end is equal to or different from the length L32 of the air spacer 110B under the source/drain diffusion region 50 between two gate structures. In some embodiments, air spacers 110C and 110D under the source/drain diffusion region has two tapered portions from the edges of the source/drain diffusion region 50 at the isolation insulating layer 20 toward the center of the source/drain diffusion region50 (along the Y direction) in plan view. The tapered portion is caused by insufficient lateral etching of the sacrificial layer 20 under the source/drain diffusion region between two gate structures along the Y direction. In some embodiments, the air spacer 110D under the source/drain diffusion region 50 between two gate structures is discontinuous along the Y direction, while the air spacer 110C under the source/drain diffusion region 50 at the left end or the right end is continuous.

In some embodiments, the sacrificial layer is formed at a relatively deeper location in the substrate so that the surface region of the substrate 10 does not contain the dopants (e.g., As). In such a case, no semiconductor epitaxial layer 25 is formed, and the surface region is utilized as a channel region and source/drain diffusion regions.

FIGS. 18A, 18B, 18C and 18D show cross sectional views of semiconductor devices according to various embodiments of the present disclosure. Materials, configurations, dimensions, processes and/or operations same as or similar to those described with the foregoing embodiments may be employed in the following embodiments and the detailed explanation may be omitted.

The location of the air spacer 110 or the embedded insulating layer is not limited to below the source/drain diffusion region.

Figure 18A:
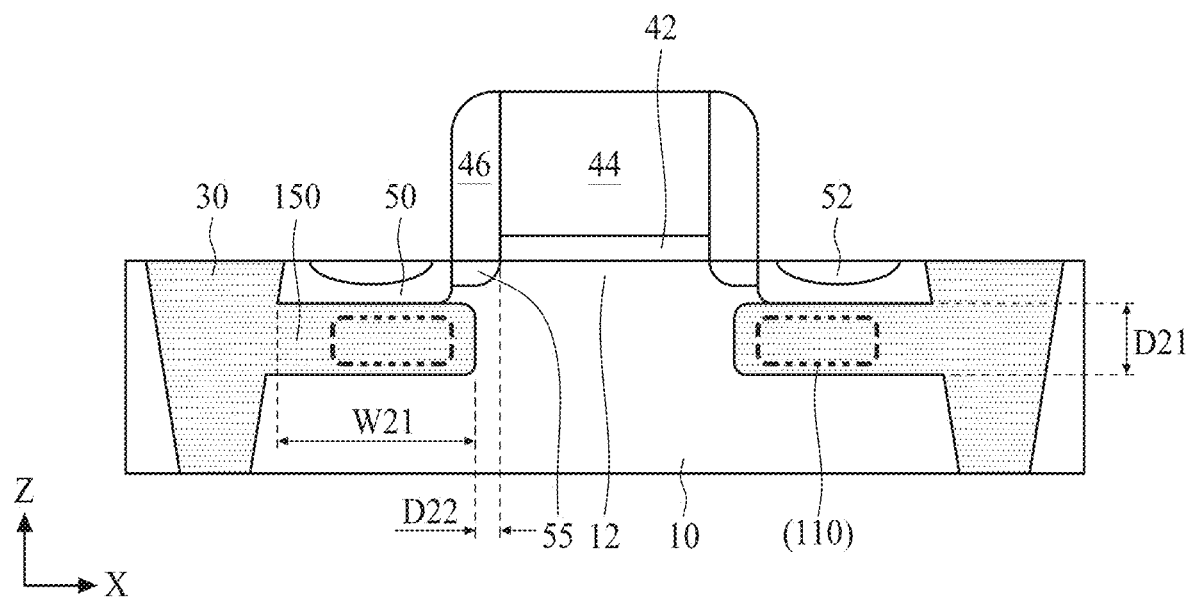
FIGS. 18A, 18B, 18C and 18D show cross sectional views of semiconductor devices according to various embodiments of the present disclosure.

As shown in FIG. 18A, an embedded insulating layer 150 continuously formed from the isolation insulating layer 30 is located below the source/drain diffusion region 50 and extends below the sidewall spacer 46 in some embodiments. In some embodiments, the thickness D21 of the embedded insulating layer 150 under the source/drain diffusion region 50 is in a range from about 10 nm to about 200 nm, and is in a range from about 30 nm to about 100 nm in other embodiments. In some embodiments, the proximity amount D22 from the end of the embedded insulating layer 150 to an edge plane of the gate electrode 44 is about a half of the thickness of the sidewall spacer or more. In some embodiments, the end of the embedded insulating layer 150 is located below the gate electrode with a penetration amount in a range from about 1 nm to about 5 nm. In some embodiments, the width W21 in the X direction of the embedded insulating layer 150 is in a range from about 100 nm to about 500 nm, and is in a range from about 200 nm to about 400 nm in other embodiments. An aspect ratio of the width W21 to the depth D21 (W21/D21) of the embedded insulating layer 150 is in a range from about 1 to about 10 in some embodiments, and is in a range from about 2 to about 5 in other embodiments. In some embodiments, an aspect ratio (W21/D21) is in a range from about 2 to about 10 and is in a range from about 3 to about 8 in other embodiments. When the aspect ratio W21/D21 is smaller than the above ranges, for example, W21 is smaller, the embedded insulating layer 150 do not sufficiently penetrate under the gate electrode, and thus it may not sufficiently suppress parasitic capacitance under the gate electrode. When the aspect ratio W21/D21 is larger than the above ranges, for example, D21 is smaller, the capacitance of the embedded insulating layer (parasitic capacitance) becomes larger, and it is difficult to remove the sacrificial layer 20 to form the space 100.

In some embodiments, the embedded insulating layer 150 does not includes an air spacer and in other embodiments, an air spacer 110 shown in a broken line is formed within the embedded insulating layer 150 similar to the foregoing embodiments. In some embodiments the end of the air spacer 110 is located below the sidewall spacer or below the gate electrode. In some embodiments, a silicide layer 52 is formed on the source/drain diffusion region 50. The silicide layer 52 includes one or more of WSi, NiSi, CoSi, TiSi, AlSi, TaSi, MoSi or any other suitable silicide. Manufacturing operation of a device shown in FIG. 18A is substantially the same as that of a device shown in FIGS. 1A and 1B as set forth above, except for the dimension of the embedded insulating layer (lateral length).

Figure 18B:
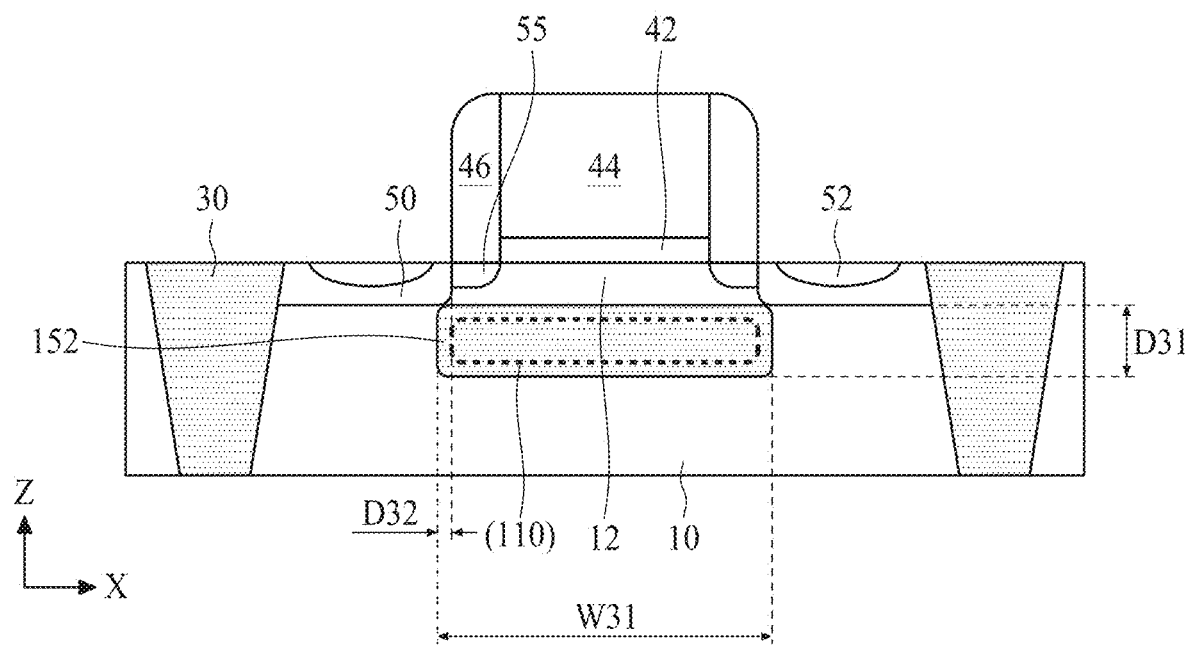

In other embodiments, as shown in FIG. 18B, an embedded insulating layer 152 is located below the gate electrode 44 and extends below the sidewall spacer 46 in some embodiments. In some embodiments, the thickness D31 of the embedded insulating layer 152 under the gate electrode 44 is in a range from about 10 nm to about 200 nm, and is in a range from about 30 nm to about 100 nm in other embodiments. In some embodiments, the end of the embedded insulating layer 152 is located below the source/drain diffusion region 50 with a penetration amount in a range from about 1 nm to about 5 nm. In some embodiments, the end of the embedded insulating layer 152 is located below the sidewall spacer.

In some embodiments, the width W31 in the X direction of the embedded insulating layer 152 is in a range from about 5 nm to about 200 nm, and is in a range from about 10 nm to about 100 nm in other embodiments, depending on the width of the gate electrode in the X direction. An aspect ratio of the width W31 to the depth D31 (W31/D31) of the embedded insulating layer 152 is in a range from about 1 to about 10 in some embodiments, and is in a range from about 2 to about 5 in other embodiments. In some embodiments, an aspect ratio (W31/D31) is in a range from about 2 to about 10 and is in a range from about 3 to about 8 in other embodiments. When the aspect ratio W31/D31 is smaller than the above ranges, for example, W31 is smaller, it may not sufficiently suppress parasitic capacitance under the gate electrode. When the aspect ratio W31/D31 is larger than the above ranges, for example, D31 is smaller, the capacitance of the embedded insulating layer (parasitic capacitance) becomes larger, and it is difficult to remove the sacrificial layer 20 to form the space 100.

In some embodiments, the embedded insulating layer 152 does not includes an air spacer and in other embodiments, an air spacer 110 shown in a broken line is formed within the embedded insulating layer 152 similar to the foregoing embodiments. In some embodiments, the embedded insulating layer 152 extends below the source/drain diffusion region 50. In some embodiments the end of the air spacer 110 is located below the sidewall spacer or below the source/drain diffusion region.

Figure 18C:
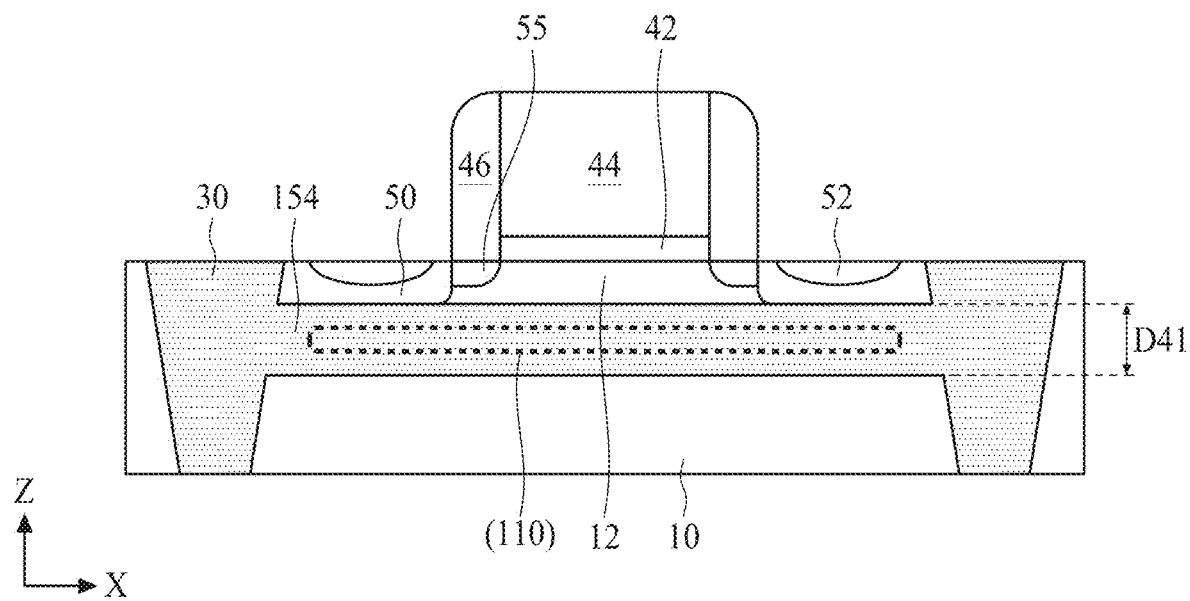

In other embodiments, as shown in FIG. 18C, an embedded insulating layer 154 is continuously formed from the isolation insulating layer 30 and located below the gate electrode 44 and the source/drain diffusion region 50. As shown in FIG. 18C, the embedded insulating layer 154 is in contact with the source/drain diffusion region 50. In some embodiments, the thickness D41 of the embedded insulating layer 154 under the gate electrode 44 is in a range from about 10 nm to about 200 nm, and is in a range from about 30 nm to about 100 nm in other embodiments. In some embodiments, the embedded insulating layer 154 does not includes an air spacer and in other embodiments, an air spacer 110 shown in a broken line is formed within the embedded insulating layer 154 similar to the foregoing embodiments.

Figure 18D:
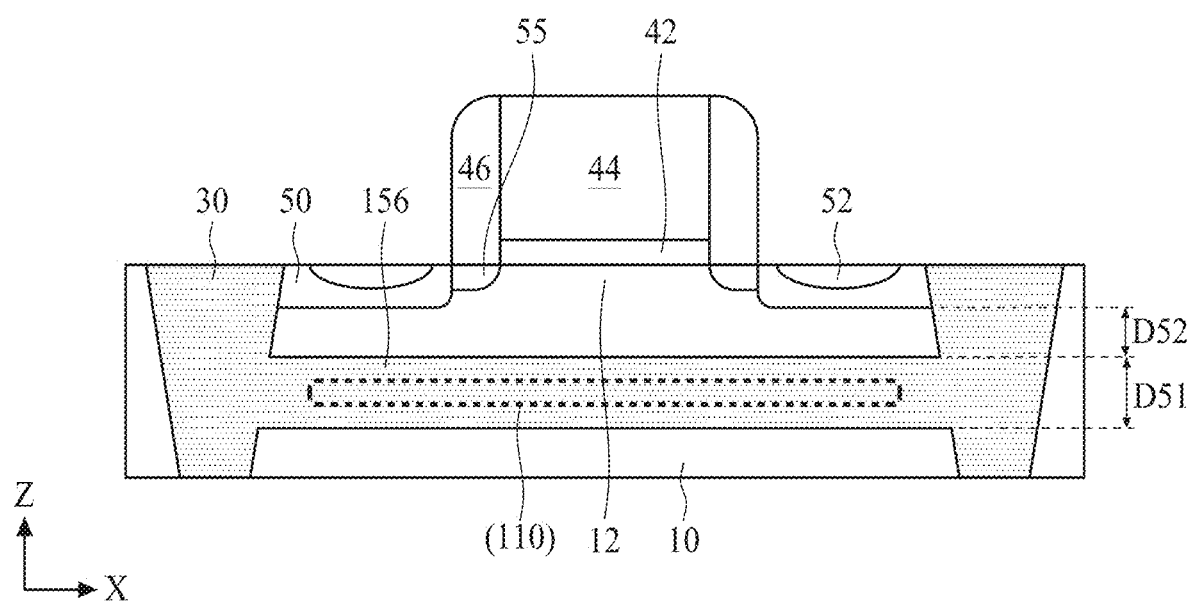

In some embodiments, as shown in FIG. 18D, an embedded insulating layer 156 is continuously formed from the isolation insulating layer 30 and located below the gate electrode 44 and the source/drain diffusion region 50. As shown in FIG. 18D, the embedded insulating layer 154 is formed deeper than the case of FIG. 18C by increasing a thickness of the epitaxial semiconductor layer 25 (channel 12) and thus is separated from the source/drain diffusion region 50. In some embodiments, the thickness D51 of the embedded insulating layer 154 under the gate electrode 44 is in a range from about 10 nm to about 200 nm, and is in a range from about 30 nm to about 100 nm in other embodiments. In some embodiments, a separation D52 between the embedded insulating layer 154 and the bottom of the source/drain diffusion region 50 is more than 0 nm and equal to or less than 50 nm. In some embodiments, the embedded insulating layer 154 does not includes an air spacer and in other embodiments, an air spacer 110 shown in a broken line is formed within the embedded insulating layer 154 similar to the foregoing embodiments.

In the embodiments, of FIGS. 18A-18D, a part of the sacrificial layer remains between the embedded insulating layer and the substrate 10 and/or the epitaxial semiconductor layer 25. In some embodiments the thickness of the residual sacrificial layer is more than 0 nm to less than about 5 nm and is in a range from about 0.5 nm to about 2 nm.

FIGS. 19-24 and 25A-25E show views of various stages for manufacturing a semiconductor device according to an embodiment of the present disclosure. FIGS. 19-24 are cross sectional views along the X direction and FIGS. 25A-25E are plan views. It is understood that additional operations can be provided before, during, and after processes shown by FIGS. 19-25E, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted. The manufacturing operation of a semiconductor device shown in FIGS. 19-25E corresponds to the semiconductor device of FIG. 18C or 18D. It is noted that FIGS. 19-24 are cross sectional view of the x-z plane corresponding to line X2-X2 of FIGS. 25A and 25E.

Figure 19:
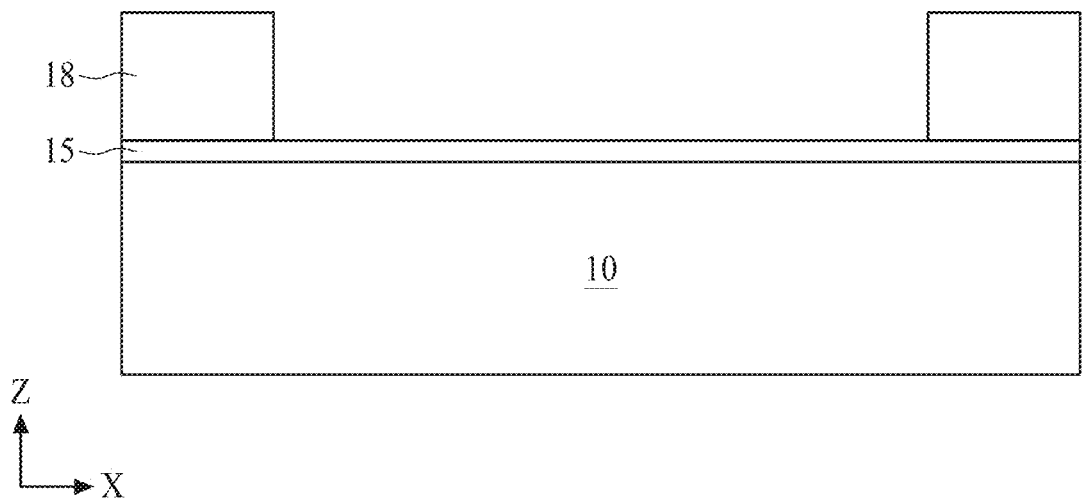
FIGS. 19, 20, 21, 22, 23 and 24 show cross sectional views of the various stages of a manufacturing operation for a semiconductor device according to an embodiment of the present disclosure.

Similar to FIG. 4, by using one or more lithography operations, a photo resist pattern as a first mask pattern 18' is formed over the cover layer 15 as shown in FIG. 19. Unlike the case of FIG. 4, the opening of the first mask pattern 18' corresponds to the location of a gate electrode and source/drain diffusion regions subsequently formed. An alignment key 202 is formed in some embodiments.

Figure 20:
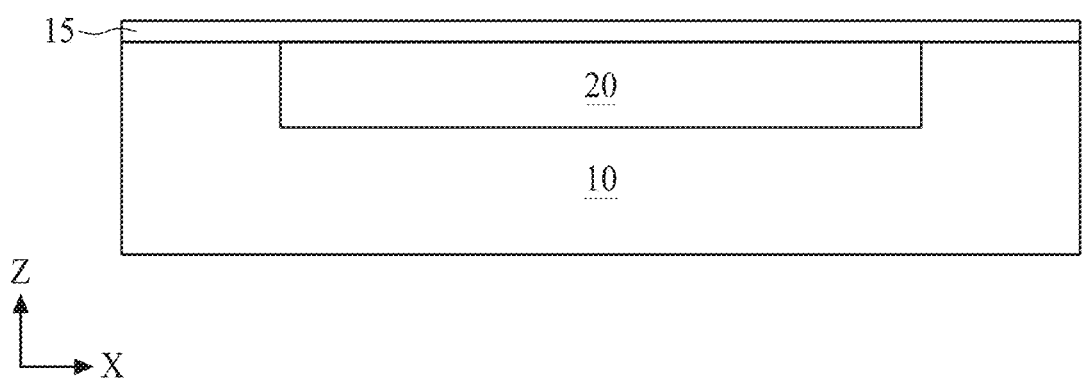
Figure 25A:
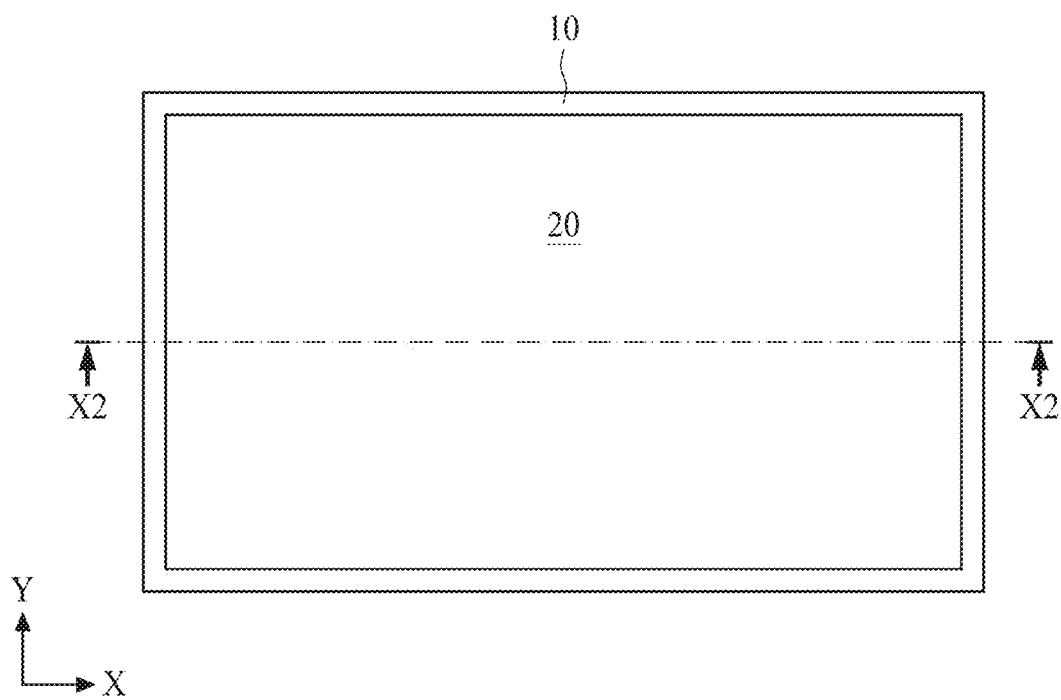
FIGS. 25A, 25B, 25C, 25D and 25E show plan views of the various stages of a manufacturing operation for a semiconductor device according to an embodiment of the present disclosure.

Similar to FIGS. 5 and 6, one or more ion implantation operations are performed to form sacrificial regions 20' containing dopants as shown in FIG. 20. FIG. 25A corresponds to a plan view (the cover layer 15 is omitted). In some embodiments, after the ion implantation operations and removal of the mask layer 18', a thermal process, for example, an anneal process, is performed similar to FIG. 6.

Figure 21:
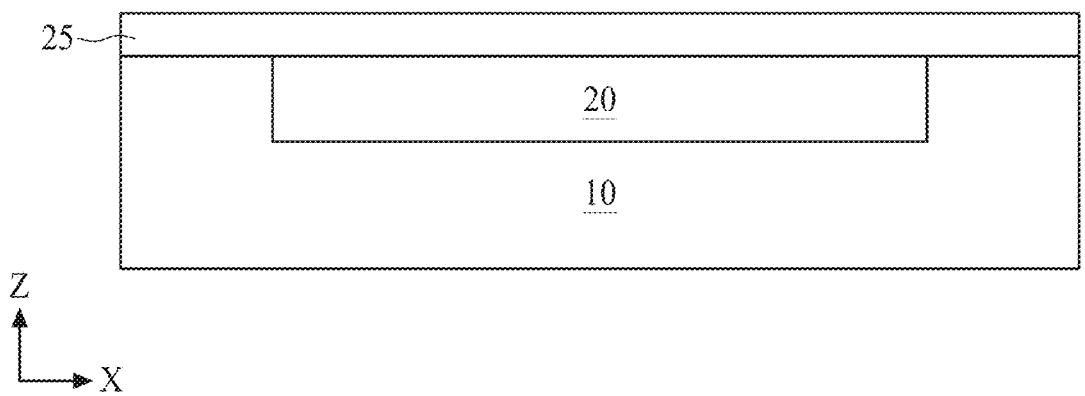
Figure 22:
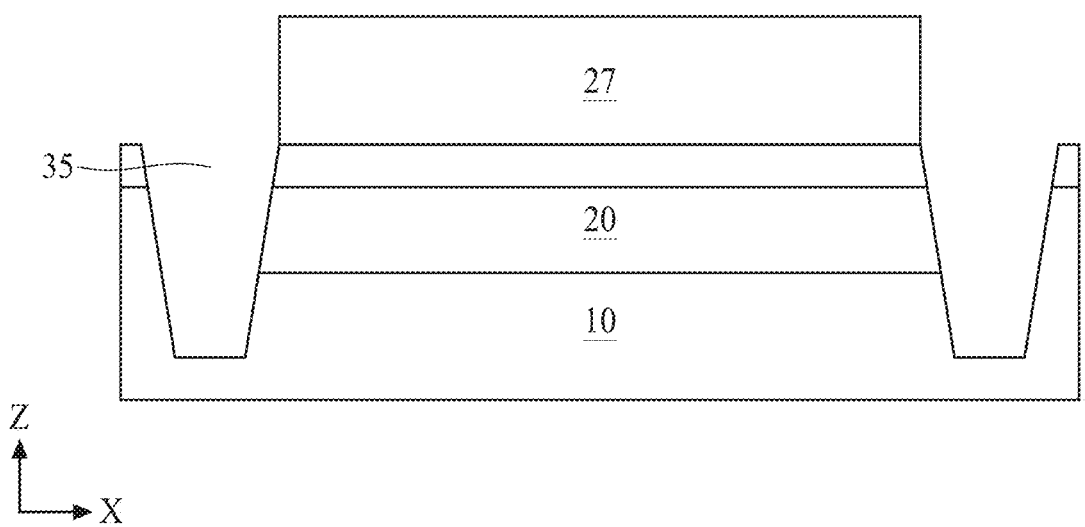
Figure 25B:
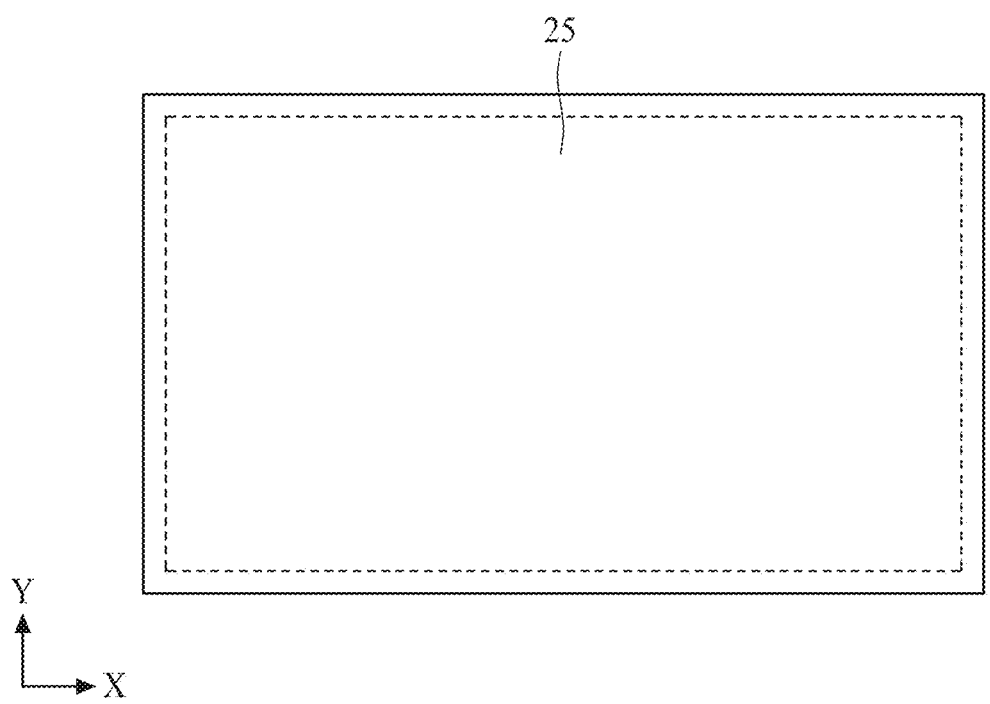

Then, similar to FIG. 7, an epitaxial semiconductor layer 25 is formed over the substrate 10 including the sacrificial layer 20', as shown in FIG. 21. FIG. 25B corresponds to a plan view. Further, similar to FIG. 8, a second mask pattern 27' is then formed over the epitaxial semiconductor layer 25 as shown in FIG. 22, and trenches 35 are formed by etching the epitaxial semiconductor layer 25, the sacrificial layer 20' and the substrate 10 as shown in FIG. 22.

Figure 23:
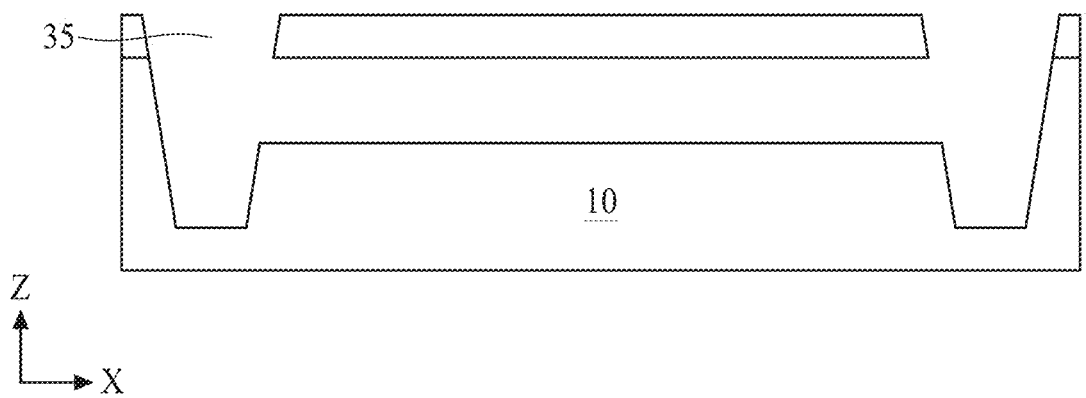
Figure 25C:
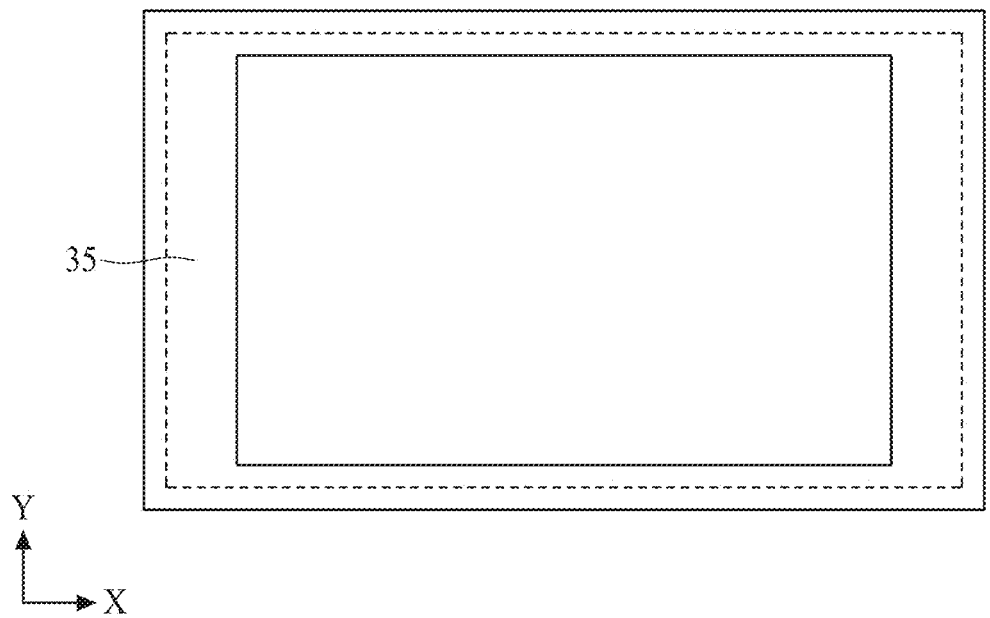

Next, similar to FIG. 10, the sacrificial layer 20' is laterally etched to form space 100' as shown in FIG. 23. FIG. 25C corresponds to a plan view. As shown in FIG. 23, the space 100' connects the trenches 35.

Figure 24:
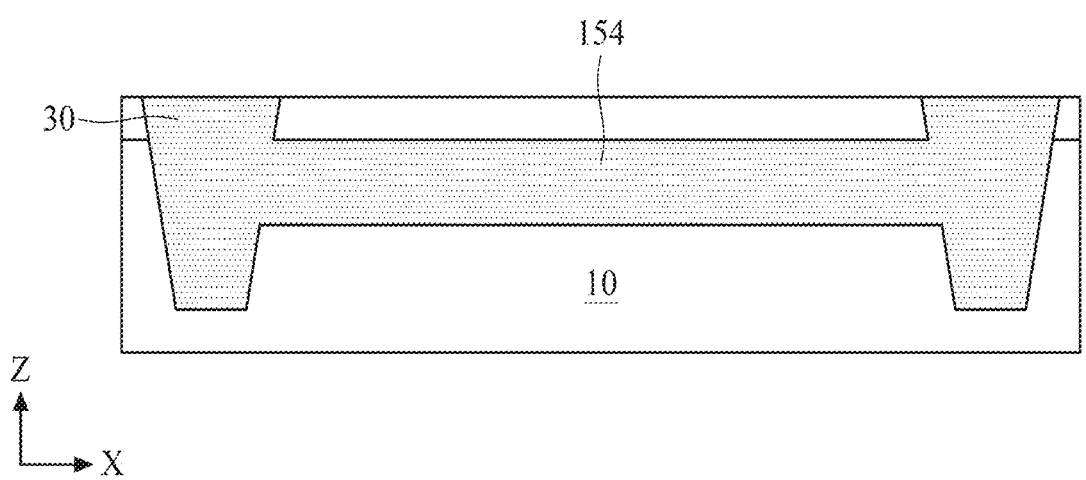
Figure 25D:
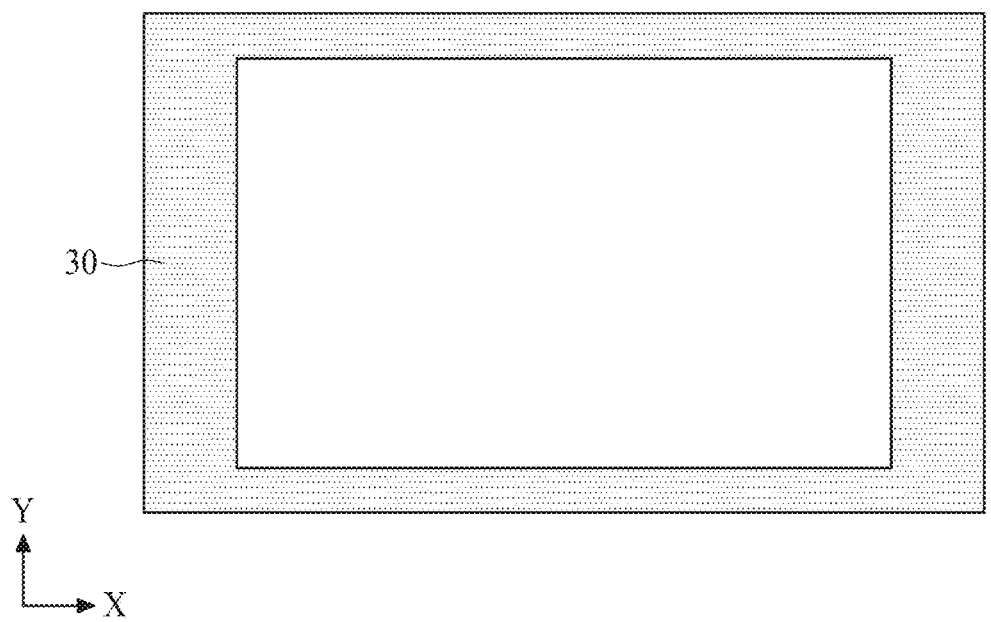

After the spaces 100' are formed, similar to FIG. 11, the isolation insulating layer 30 is formed in the trenches 35 and the spaces 100' as shown in FIG. 24, thereby forming the embedded insulating layer 154. FIG. 25D corresponds to a plan view.

Figure 25E:
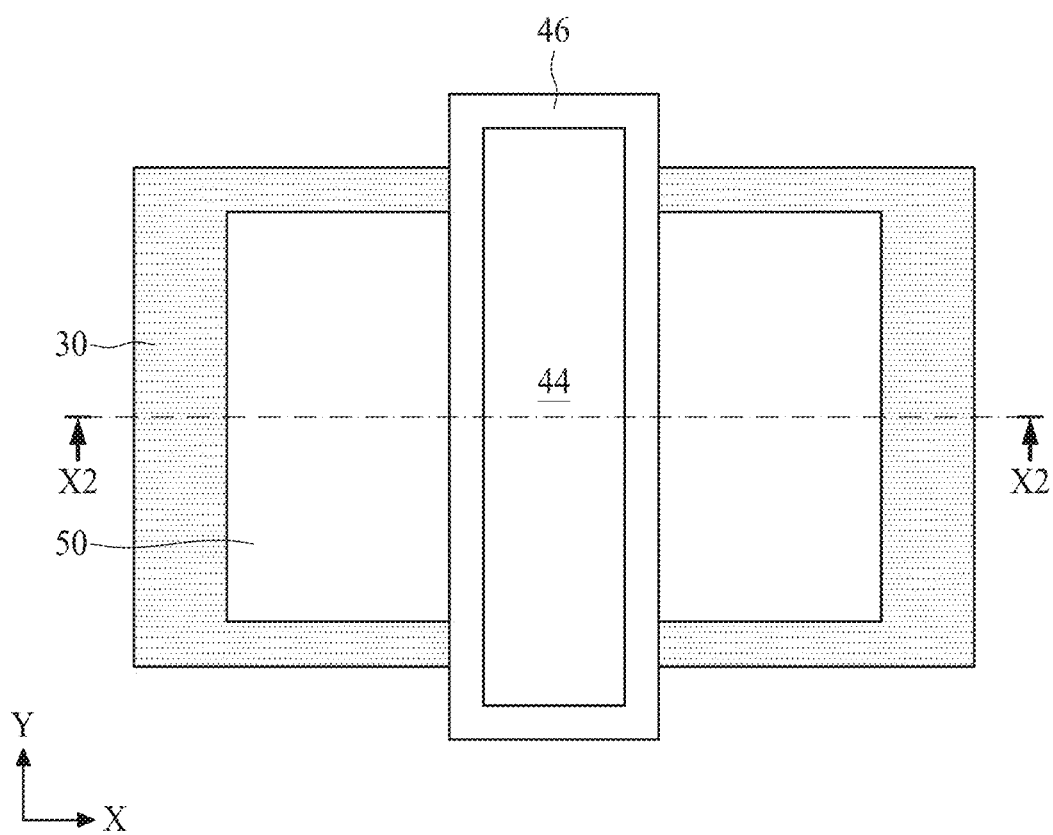

After the insulating layer 30 and the embedded insulating layer 154 are formed, a gate structure including the gate dielectric layer 42, the gate electrode layer 44 and the gate sidewall spacer 46 is formed over a channel region of the epitaxial semiconductor layer 25, as shown in FIG. 18C or 18D. FIG. 25E corresponds to a plan view. Further, the source/drain diffusion regions 50 and the source/drain extension regions 55 are formed as shown in FIG. 18C or 18D. When the thickness of the epitaxial semiconductor layer 25 is larger, the source/drain diffusion region 50 is separated from the embedded insulating layer 154 as shown in FIG. 18D.

FIGS. 26A-31B and 32A-32E show views of various stages for manufacturing a semiconductor device according to an embodiment of the present disclosure. The "A" figures (FIGS. 26A, . . . 31A) are cross sectional views along the X direction (X2-X2 of FIG. 32A), the "B" figures (FIGS. 26B, . . . 31B) are cross sectional views along the Y direction (Y2-Y2 of FIG. 32A), and FIGS. 32A-32E are plan views. It is understood that additional operations can be provided before, during, and after processes shown by FIGS. 26-32E, and some of the operations described below are replaced or eliminated, for additional embodiments of the method. The order of the operations/processes may be interchangeable. Materials, configurations, dimensions, processes and/or operations same as or similar to those described with the foregoing embodiments may be employed in the following embodiments and the detailed explanation may be omitted. The manufacturing operation of a semiconductor device shown in FIGS. 26A-32E corresponds to the semiconductor device of FIG. 18B.

Figure 26A:
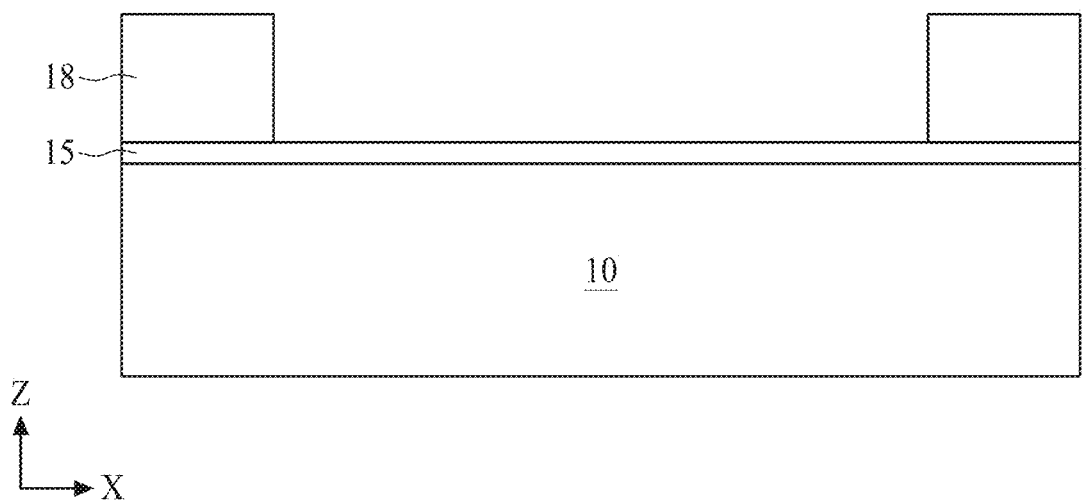
FIGS. 26A, 26B, 27A, 27B, 28A, 28B, 29A, 29B, 30A, 30B, 31A and 31B show cross sectional views of the various stages of a manufacturing operation for a semiconductor device according to an embodiment of the present disclosure.
Figure 26B:
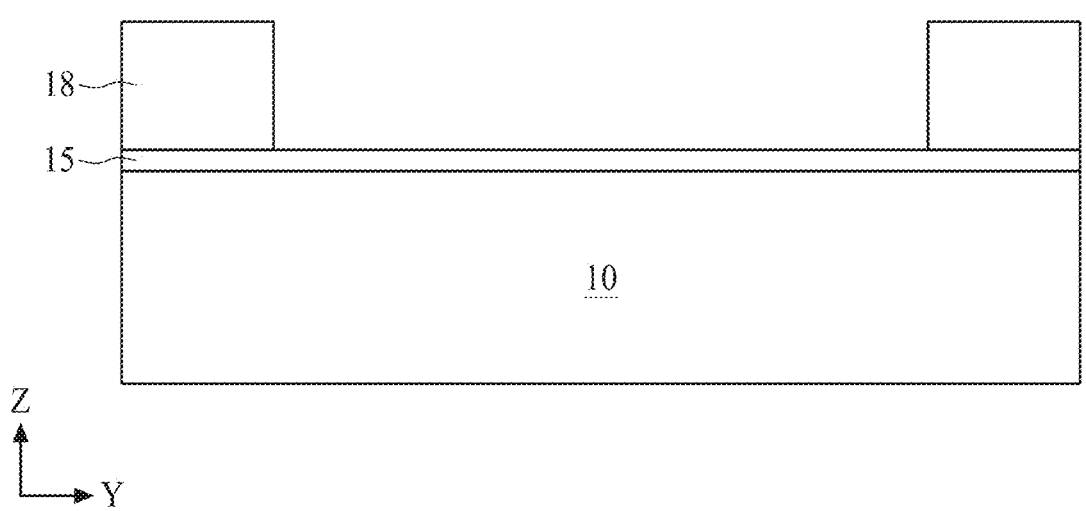

Similar to FIG. 4, by using one or more lithography operations, a photo resist pattern as a first mask pattern 18" is formed over the cover layer 15 as shown in FIGS. 26A and 26B. Unlike the case of FIG. 4, the opening of the first mask pattern 18" corresponds to the location of a gate electrode and source/drain diffusion regions subsequently formed.

Figure 27A:
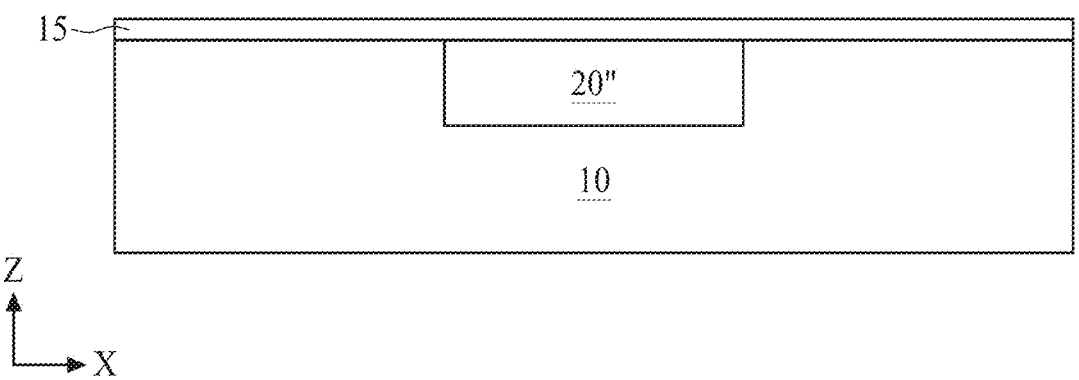
Figure 27B:
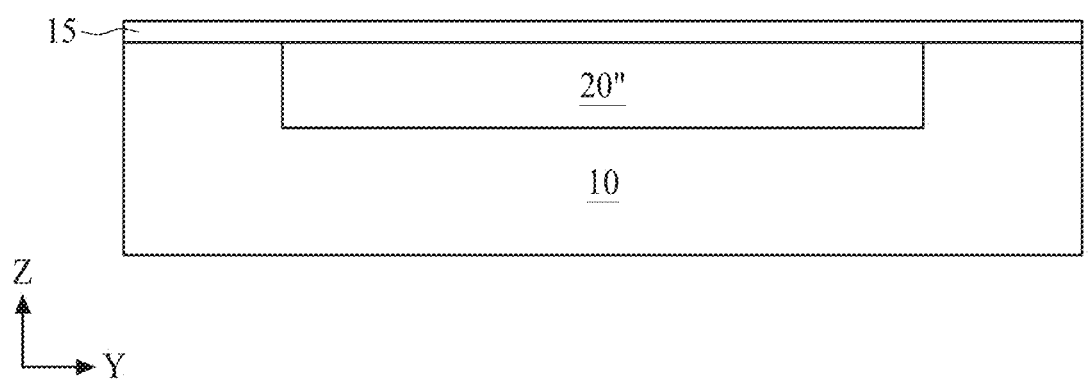
Figure 32A:
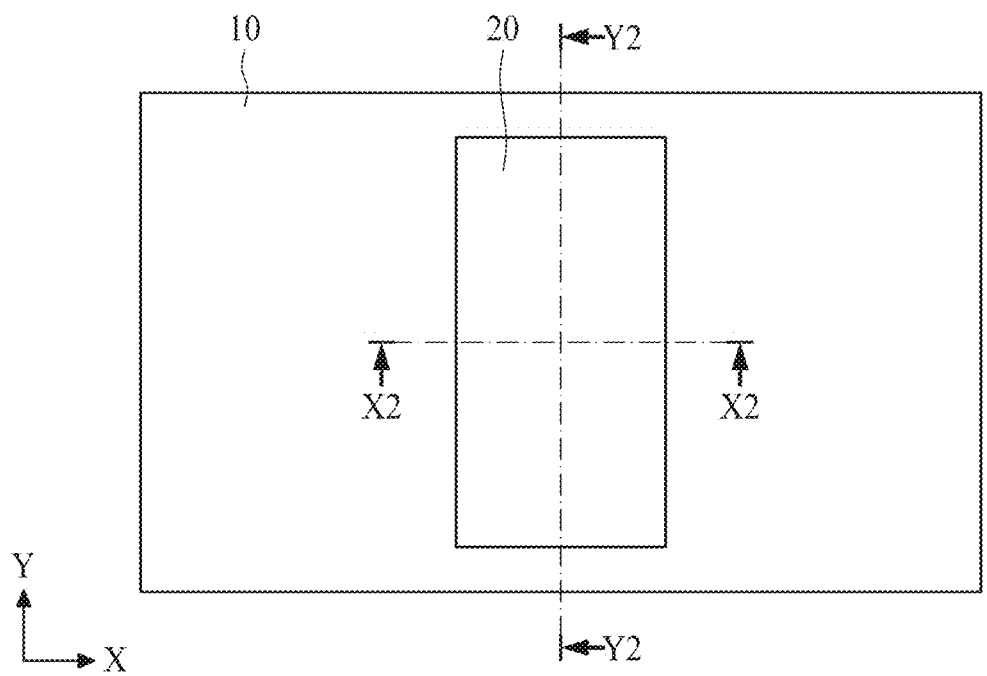
FIGS. 32A, 32B, 32C, 32D and 32E show plan views of the various stages of a manufacturing operation for a semiconductor device according to an embodiment of the present disclosure.

Similar to FIGS. 5 and 6, one or more ion implantation operations are performed to form sacrificial regions 20" containing dopants as shown in FIGS. 27A and 27B. FIG. 32A corresponds to a plan view (the cover layer 15 is omitted). In some embodiments, after the ion implantation operations and removal of the mask layer 18", a thermal process, for example, an anneal process, is performed similar to FIG. 6.

Figure 28A:
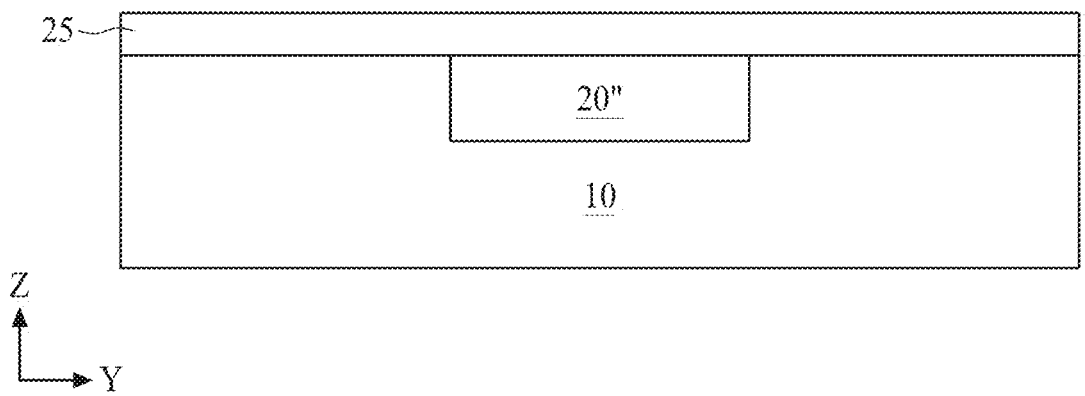
Figure 28B:
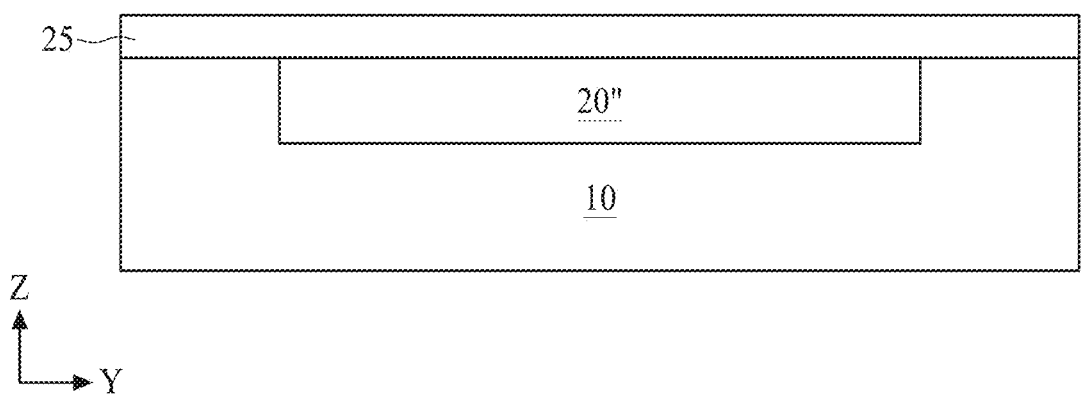
Figure 29A:
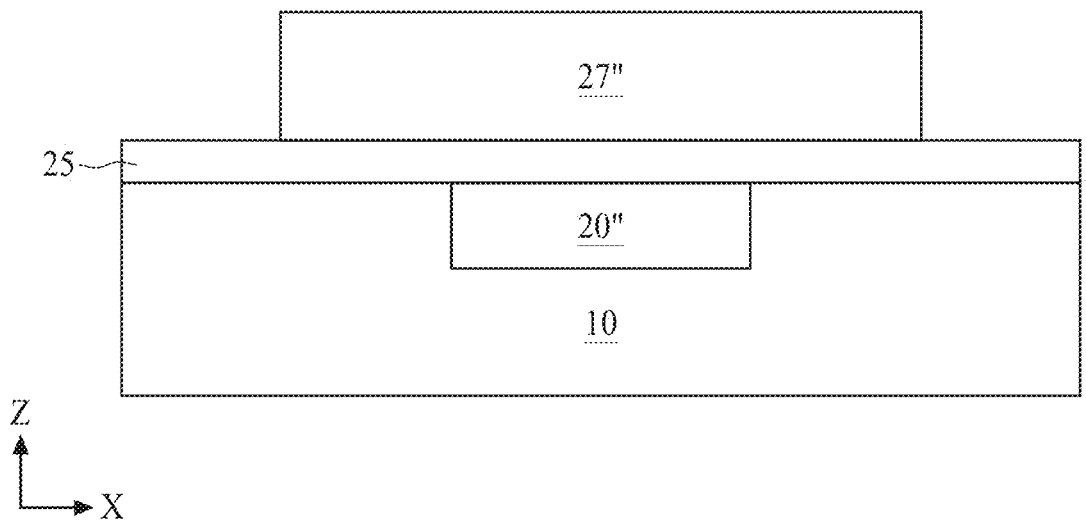
Figure 29B:
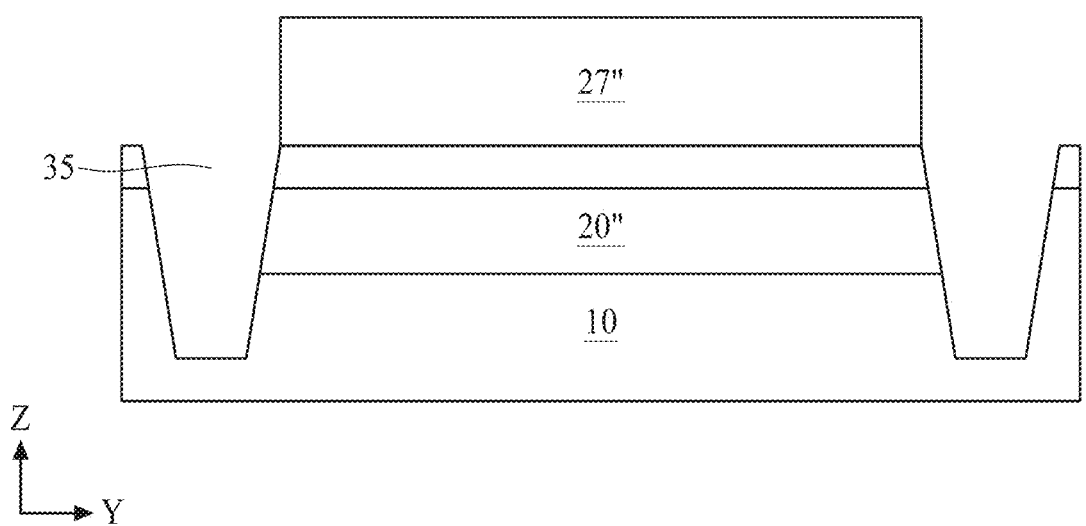
Figure 32B:
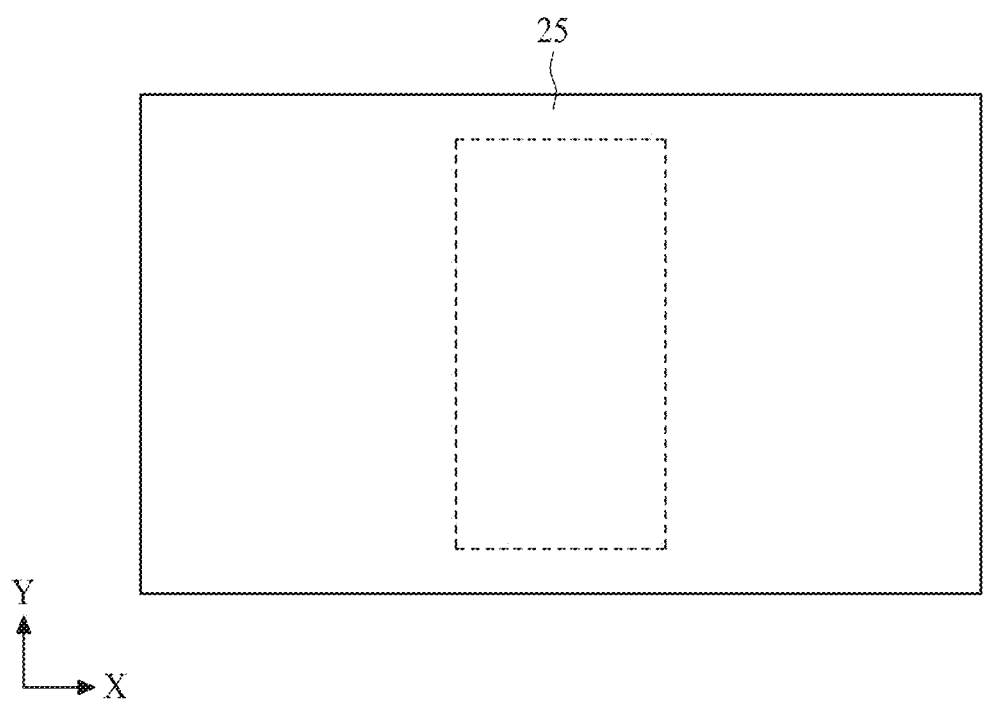

Then, similar to FIG. 7, an epitaxial semiconductor layer 25 is formed over the substrate 10 including the sacrificial layer 20", as shown in FIGS. 28A and 28B. FIG. 32B corresponds to a plan view. Further, similar to FIG. 8, a second mask pattern 27" is then formed over the epitaxial semiconductor layer 25 as shown in FIGS. 29A and 29B, and trenches 35 are formed by etching the epitaxial semiconductor layer 25, the sacrificial layer 20" and the substrate 10 as shown in FIGS. 29A and 29B.

Figure 30A:
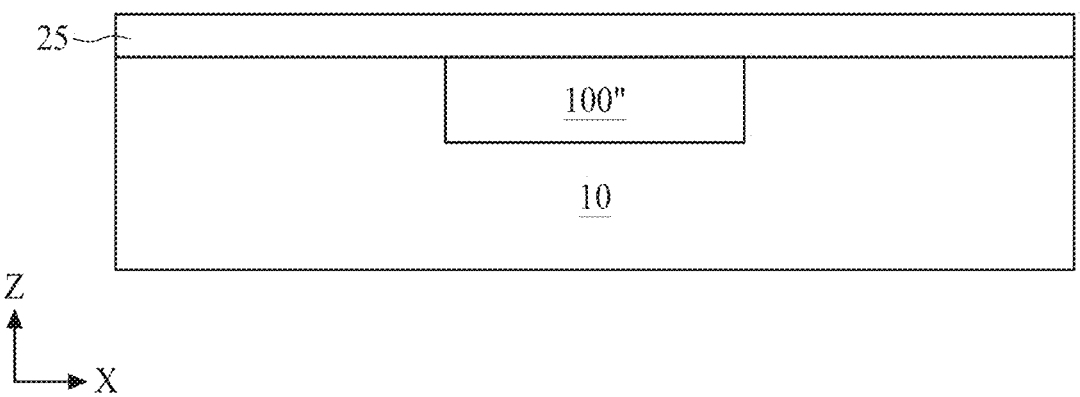
Figure 30B:
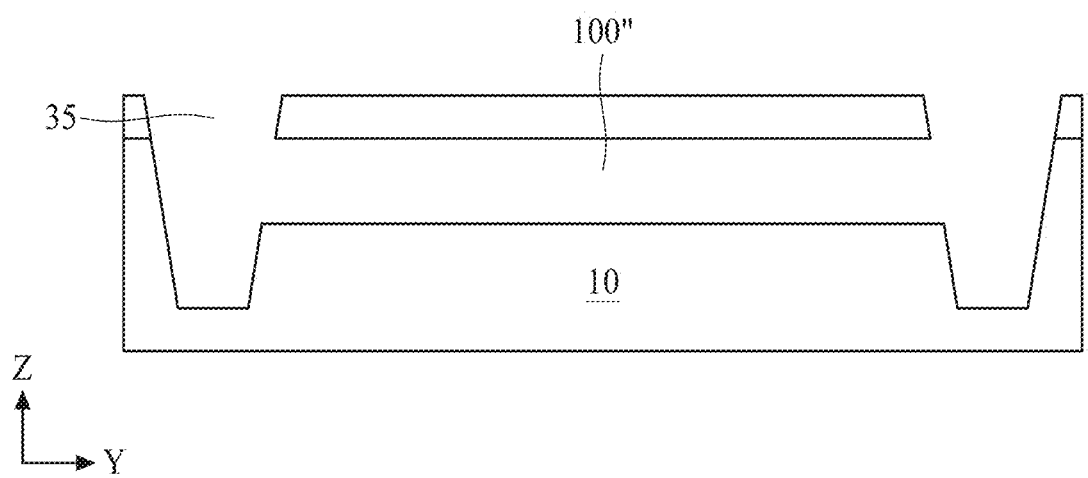
Figure 32C:
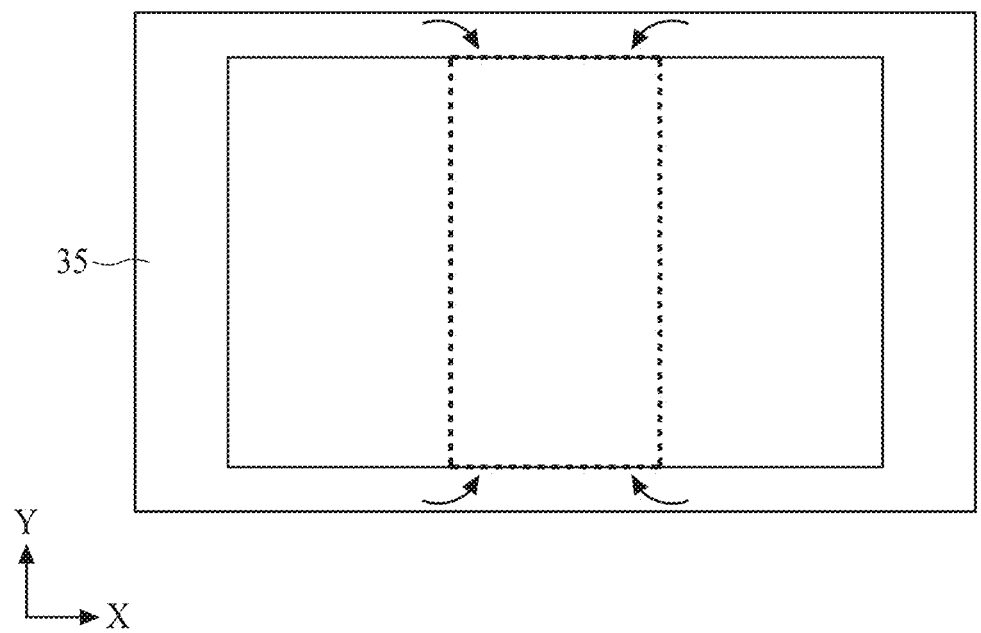

Next, similar to FIG. 10, the sacrificial layer 20" is laterally etched to form space 100" as shown in FIGS. 30A and 30B. FIG. 32C corresponds to a plan view. The arrows in FIG. 32C show lateral etching of the sacrificial layer 20". As shown in FIG. 30B, the space 100" connects the trenches 35 in the Y direction (gate extending direction).

Figure 31A:
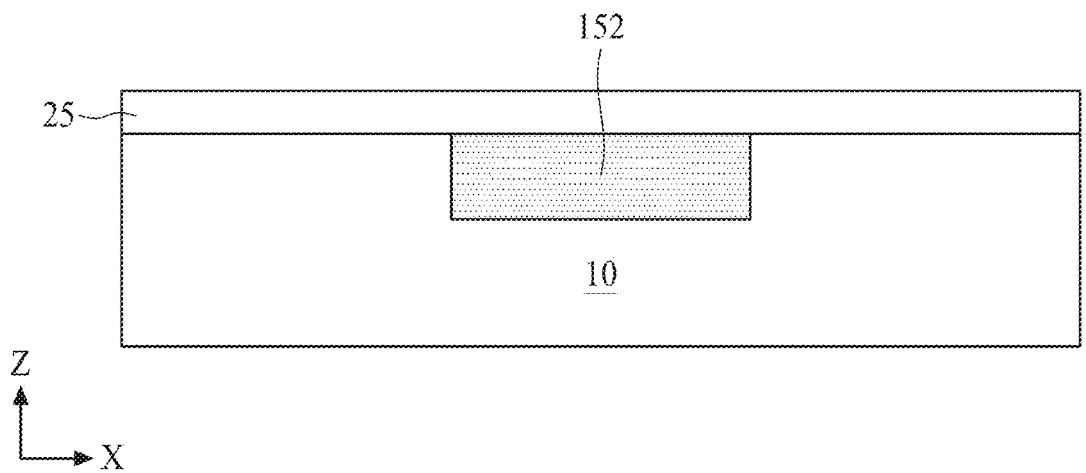
Figure 31B:
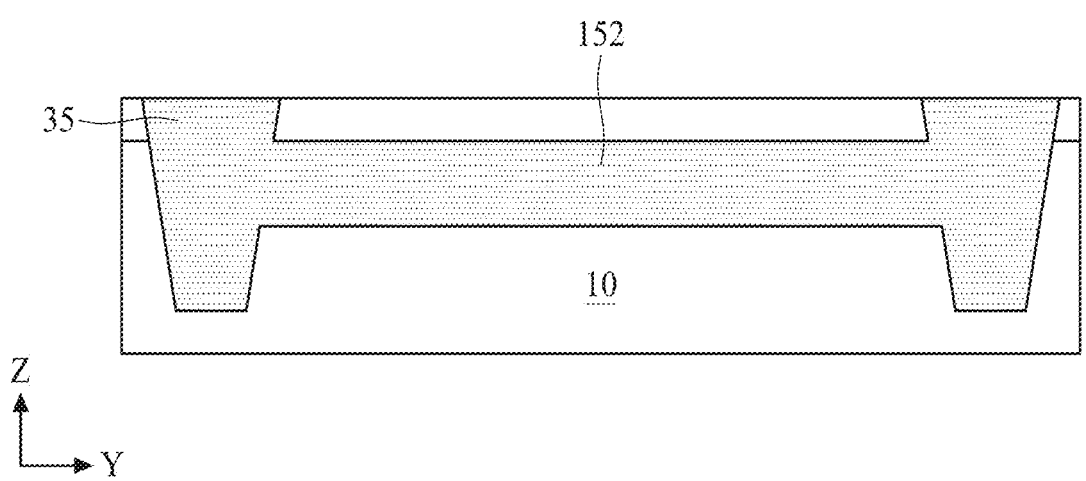
Figure 32D:
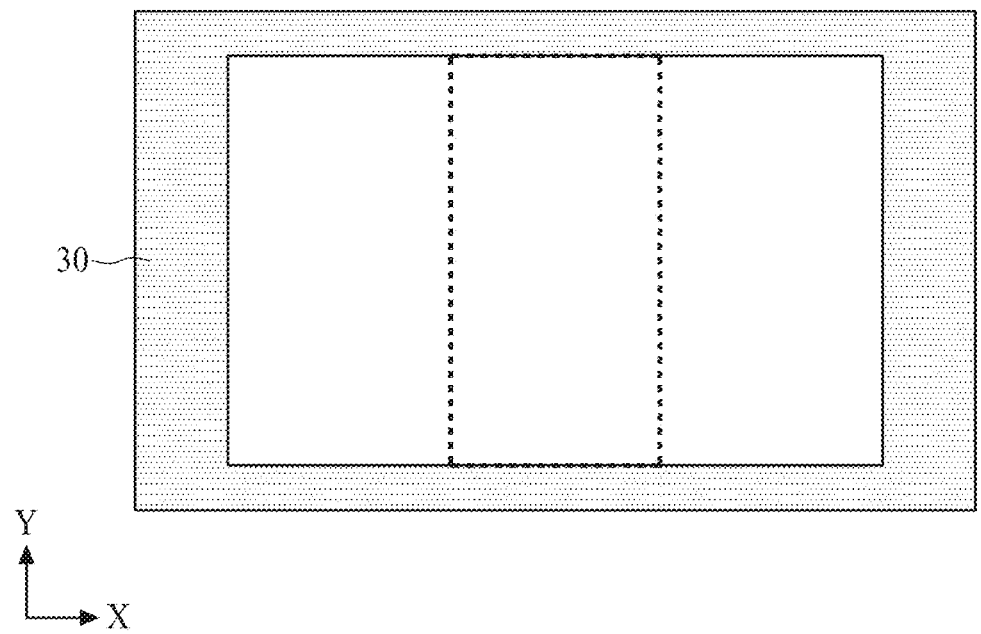

After the spaces 100" are formed, similar to FIG. 11, the isolation insulating layer 30 is formed in the trenches 35 and the spaces 100" as shown in FIGS. 31A and 31B, thereby forming the embedded insulating layer 152. FIG. 32D corresponds to a plan view.

Figure 32E:
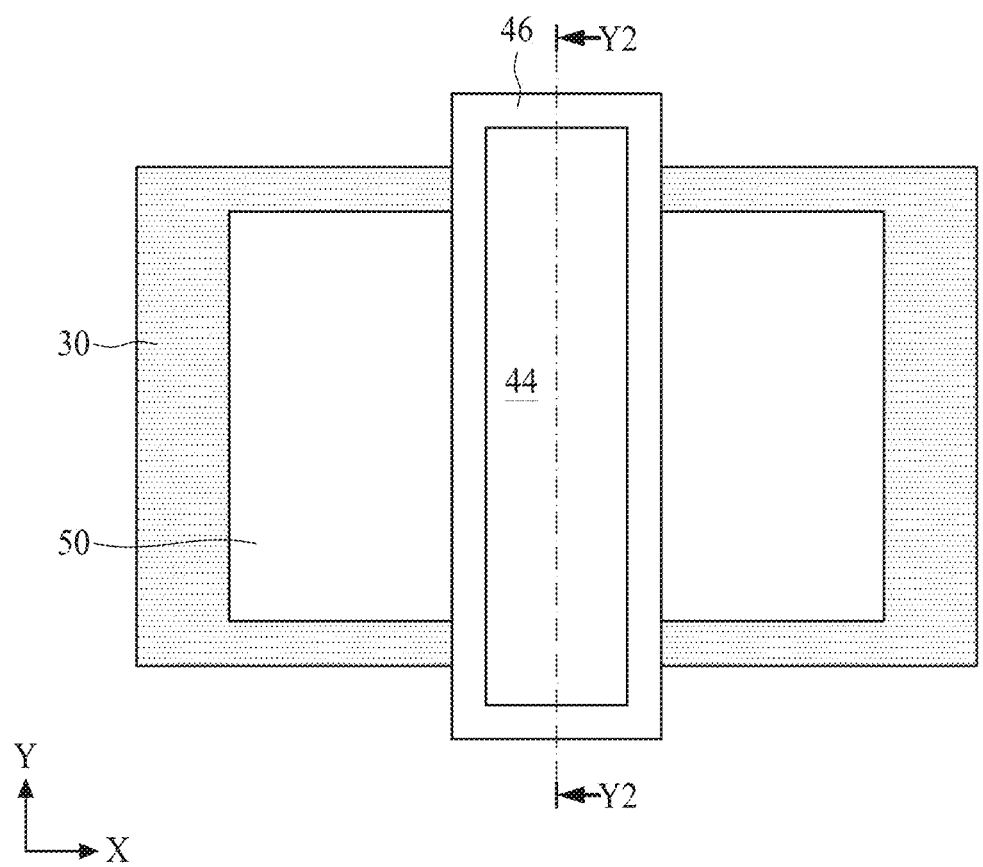

After the insulating layer 30 and the embedded insulating layer 152 are formed, a gate structure including the gate dielectric layer 42, the gate electrode layer 44 and the gate sidewall spacer 46 is formed over a channel region of the epitaxial semiconductor layer 25, as shown in FIG. 18B. FIG. 32E corresponds to a plan view. Further, the source/drain diffusion regions 50 and the source/drain extension regions 55 are formed as shown in FIG. 18B.

Unlike a SOI substrate in which a layer of oxide is uniformly formed over the entire substrate, the embedded insulating layers are formed discontinuously where they are necessary.

Figure 33A:
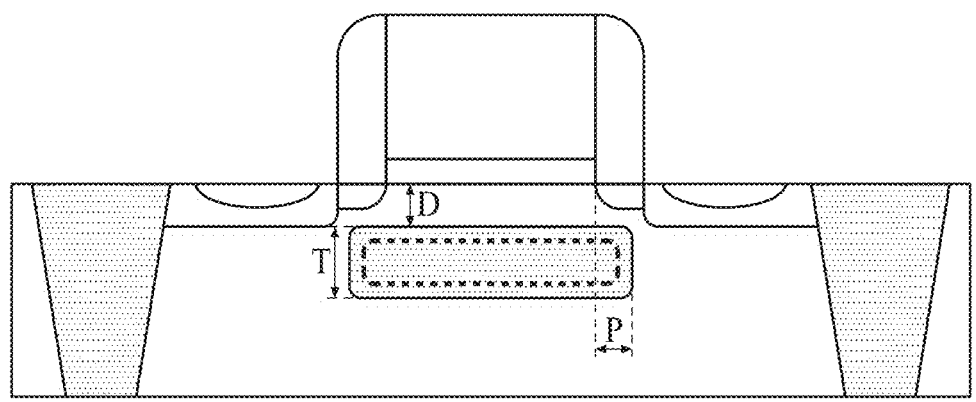
FIGS. 33A and 33B show performance comparison among various configuration of a semiconductor device according to an embodiment of the present disclosure.
Figure 33B:
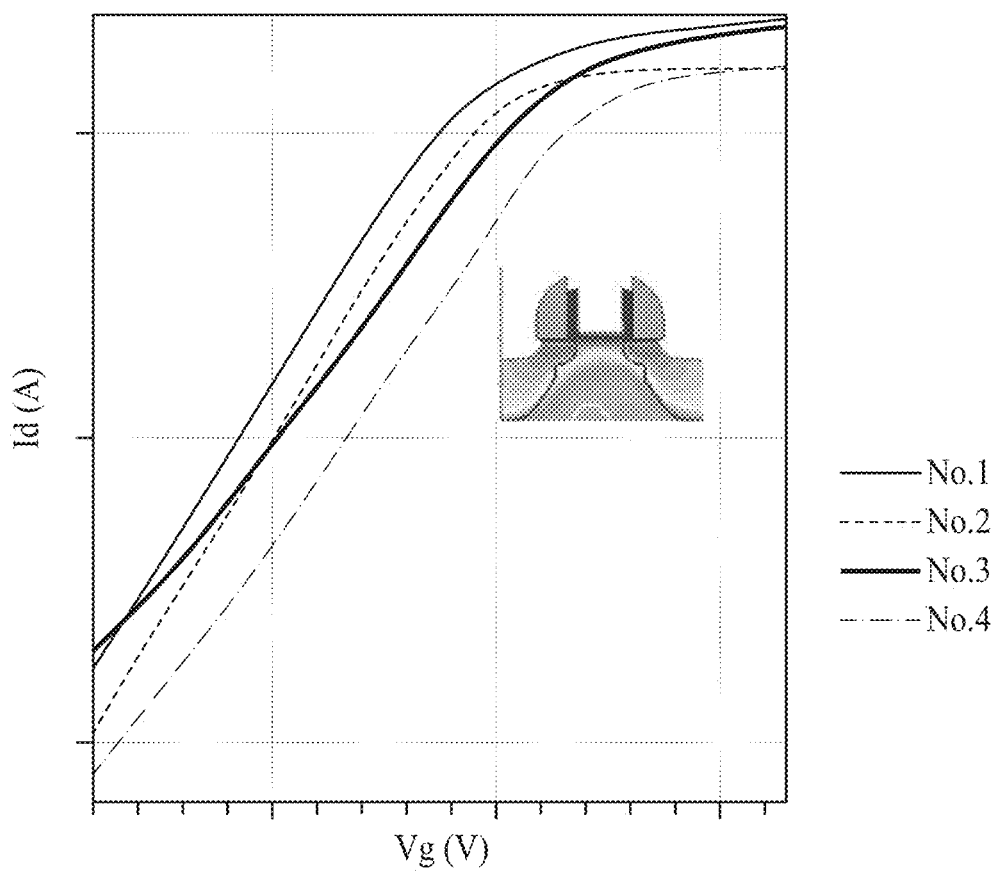

FIGS. 33A and 33B show performance comparison among various configuration of a semiconductor device according to an embodiment of the present disclosure. In FIG. 33A, the depth D (nm) is a distance between the upper surface of the channel region and the top of the embedded insulating layer, the thickness T (nm) is a thickness of the embedded insulating layer and the proximity P (nm) is a distance between an lateral edge of the embedded insulating layer and the interface between the gate electrode and the gate sidewall spacer. When D, T and/or P is increases, DC performances (e.g., DIBL (drain induced barrier lowering), Ion-off and SSsat) improve by about 40%-60% for DIBL, about 25%-50% for ΔIon-off and about 10%-20% for ΔSSsat. FIG. 33B shows source-drain current Id for the cases with the embedded insulating layer (D=5 nm) (curve Nos. 1 and 2) and without an embedded insulating layer (curve Nos. 3 and 4). The solid lines show saturated cases, and the broken lines show linear cases. As shown in FIG. 33B, the device performance is improved by employing the embedded insulating layers.

In the embodiments of the present disclosure, an air spacer and/or an embedded insulating layer is disposed below the source and/or the drain diffusion regions and/or the gate electrode, and thus parasitic capacitance between the source/drain diffusion region and/or the gate electrode and the substrate can be suppressed or eliminated, which in turn can reduce power consumption and increase speed of the semiconductor device. Since a costly silicon-on-insulator (SOI) wafer is not necessary, the present embodiments can provide a low cost manufacturing operation of a semiconductor device. In addition, since the location (depth) and/or thickness of the embedded insulating layer can be adjusted by adjusting, for example, ion implantation conditions, device performances can be more effectively adjusted or improved.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a field effect transistor (FET), a sacrificial region is formed in a substrate and a trench is formed in the substrate. A part of the sacrificial region is exposed in the trench. A space is formed by at least partially etching the sacrificial region, an isolation insulating layer is formed by filling the trench and an embedded insulating layer by filling the space, with an insulating material, and a gate structure and a source/drain region are formed. The embedded insulating layer is located below a part of the gate structure. In one or more of the foregoing and following embodiments, the sacrificial region is formed by an ion implantation operation.

In one or more of the foregoing and following embodiments, ions of arsenic are implanted by the ion implantation operation. In one or more of the foregoing and following embodiments, a dose amount in the ion implantation operation is in a range from $5\times10^{13}$ ions/cm$^2$ to $5\times10^{15}$ ions/cm$^2$. In one or more of the foregoing and following embodiments, an acceleration voltage in the ion implantation operation is in a range from 0.5 keV to 10 keV. In one or more of the foregoing and following embodiments, the space has a rectangular shape. In one or more of the foregoing and following embodiments, the at least partially etching the sacrificial region comprises a dry etching operation using a chlorine containing gas. In one or more of the foregoing and following embodiments, the embedded insulating layer is located below the gate structure. In one or more of the foregoing and following embodiments, the at least partially etching the sacrificial region comprises a wet etching operation using a tetramethylammonium hydroxide (TMAH) aqueous solution. In one or more of the foregoing and following embodiments, the embedded insulating layer connects isolation insulating layers. In one or more of the foregoing and following embodiments, the air spacer is formed in the embedded insulating layer. In one or more of the foregoing and following embodiments, the air spacer is fully enclosed by an insulating material of the embedded insulating layer. In one or more of the foregoing and following embodiments, an impurity containing region containing an impurity in an amount higher than the substrate is disposed between the space and the substrate.

In accordance with another aspect of the present disclosure, in a method of manufacturing a semiconductor device including a FET, a sacrificial region is formed in a substrate, an epitaxial semiconductor layer is formed over the substrate and a trench is formed by etching part of the epitaxial semiconductor layer, the sacrificial region and the substrate. A part of the sacrificial region is exposed in the trench. A space is formed by laterally etching the sacrificial region in a first direction, an isolation insulating layer is formed by filling the trench and an embedded insulating layer by filling the space, with an insulating material, and a gate structure and a source/drain region are formed. The gate structure extends in the first direction, and the embedded insulating layer is located below the gate structure. In one or more of the foregoing and following embodiments, the sacrificial region is formed by an ion implantation operation. In one or more of the foregoing and following embodiments, an impurity amount of the sacrificial region is in a range from $1\times10^{19}$ atoms/cm$^3$ to $5\times10^{21}$ atoms/cm$^3$. In one or more of the foregoing and following embodiments, a thickness of the epitaxial semiconductor layer is in a range from 5 nm to 100 nm. In one or more of the foregoing and following embodiments, the embedded insulating layer includes an air spacer, and a width of the air spacer varies along the first direction in plan view. In one or more of the foregoing and following embodiments, the embedded insulating layer includes an air spacer, and the air spacer is discontinuous under the source/drain region along the first direction in plan view.

In accordance with another aspect of the present disclosure, a semiconductor device including a FET includes an isolation insulating layer disposed in a trench of the substrate, a gate dielectric layer disposed over a channel region of the substrate, a gate electrode disposed over the gate dielectric layer, a source and a drain disposed adjacent to the channel region, and an embedded insulating layer disposed below the gate electrode and is separated from the isolation insulating layer in a source-to-drain direction in a cross section cutting a center of the gate electrode. In one or more of the foregoing and following embodiments, both ends of the embedded insulating layer in a gate extending direction are connected to the isolation insulating layer. In one or more of the foregoing and following embodiments, an air spacer formed in the embedded insulating layer. In one or more of the foregoing and following embodiments, an impurity containing region containing an impurity in an amount higher than the substrate is disposed between the embedded insulating layer and the substrate. In accordance with another aspect of the present disclosure, a semiconductor device including a FET includes an isolation insulating layer disposed in a trench of the substrate, a gate dielectric layer disposed over a channel region of the substrate, a gate electrode disposed over the gate dielectric layer, a source and a drain disposed adjacent to the channel region, and an embedded insulating layer disposed below the source, the drain and the gate electrode and both ends of the embedded insulating layer are connected to the isolation insulating layer. In one or more of the foregoing and following embodiments, both ends of the embedded insulating layer in a gate extending direction are connected to the isolation insulating layer. In one or more of the foregoing and following embodiments, a bottom of the isolation insulating layer is deeper than a bottom of the embedded insulating layer.

The foregoing outlines features of several embodiments or examples so that those skilled in the art may better understand the aspects of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a FET, comprising:
   an isolation insulating layer disposed in a trench of a substrate;
   a gate dielectric layer disposed over a channel region of the substrate;
   a gate electrode disposed over the gate dielectric layer;
   a source and a drain disposed adjacent to the channel region; and
   an air spacer formed in a space below the source,
   wherein an impurity containing region containing an impurity in an amount higher than the substrate is disposed between the space and the substrate.

2. The semiconductor device of claim 1, wherein the air spacer is fully enclosed by an insulating material of the isolation insulating layer.

3. The semiconductor device of claim 1, wherein the space has a rectangular shape.

4. The semiconductor device of claim 1, wherein the space has a triangular or trapezoid shape.

5. The semiconductor device of claim 1, wherein one surface defining the space has a zig-zag surface.

6. The semiconductor device of claim 1, wherein a width of the air spacer along a direction in which the gate electrode extends varies in plan view.

7. The semiconductor device of claim 1, wherein a width of the air spacer along a direction in which the gate electrode extends becomes smaller as a distance from the trench increases in plan view.

8. The semiconductor device of claim 1, wherein a depth of the air spacer becomes smaller as a distance from the trench increases along a direction in which the gate electrode extends.

9. The semiconductor device of claim 1, wherein the air spacer is discontinuous under the source along a direction in which the gate electrode extends in plan view.

10. The semiconductor device of claim 1, wherein the impurity containing region has a triangular shape in a cross section.

11. A semiconductor device including a FET, comprising:
an isolation insulating layer disposed in a trench of a substrate and surrounding an active region;
gate structures disposed over the active region;
source/drain regions disposed adjacent to the gate structures in plan view; and
air spacers formed in spaces below the source/drain regions, respectively, wherein:
an isolation structure is disposed between adjacent gate structures,
the isolation structure incudes a vertical portion and horizontal portions laterally extending from the vertical portion,
the air spacers are disposed in the horizontal portions, and
each of the spaces has a triangular shape in a cross section.

12. The semiconductor device of claim 11, wherein each of the air spacers is fully enclosed by an insulating material of the isolation insulating layer.

13. The semiconductor device of claim 11, wherein a ratio of a width of the air space to a depth of the air space is in a range from 2 to 10.

14. The semiconductor device of claim 11, wherein a width of at least one of the air spacers varies along a direction in which the gate structures extend.

15. The semiconductor device of claim 11, wherein a width of at least one of the air spacers becomes smaller as a distance from a trench along a direction in which the gate structures extend increases.

16. The semiconductor device of claim 11, wherein at least one of the air spacers is discontinuous under a corresponding one of the source/drain regions along a direction in which the gate structures extend.

17. A semiconductor device including a FET, comprising:
an isolation insulating layer disposed in a trench of a substrate;
a gate dielectric layer disposed over a channel region of the substrate;
a gate electrode disposed over the gate dielectric layer;
a source and a drain disposed adjacent to the channel region; and
an air spacer formed in a space below the source,
wherein an impurity containing region containing an impurity in an amount higher than the substrate is disposed between the air spacer and the substrate, and
the air spacer is disposed between the source or the drain and the impurity containing region.

18. The semiconductor device of claim 17, wherein the space has a rectangular shape.

19. The semiconductor device of claim 17, wherein the space has a triangular shape.

20. The semiconductor device of claim 17, wherein the space has a trapezoid shape.

* * * * *